United States Patent
Liao et al.

(10) Patent No.: US 9,991,216 B2
(45) Date of Patent: Jun. 5, 2018

(54) ANTENNA CAVITY STRUCTURE FOR INTEGRATED PATCH ANTENNA IN INTEGRATED FAN-OUT PACKAGING

(71) Applicant: Taiwan Semiconductor Manufacturing Co., Ltd., Hsin-chu (TW)

(72) Inventors: Wen-Shiang Liao, Toufen Township (TW); Chewn-Pu Jou, Hsin-chu (TW); Feng Wei Kuo, Zhudong Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days. days.

(21) Appl. No.: 15/621,084

(22) Filed: Jun. 13, 2017

(65) Prior Publication Data

US 2017/0278808 A1 Sep. 28, 2017

Related U.S. Application Data

(60) Division of application No. 15/056,030, filed on Feb. 29, 2016, now Pat. No. 9,711,465, which is a (Continued)

(51) Int. Cl.
*H01L 23/66* (2006.01)
*H01Q 9/04* (2006.01)
(Continued)

(52) U.S. Cl.
CPC .......... *H01L 23/66* (2013.01); *H01L 21/4853* (2013.01); *H01L 23/49816* (2013.01); (Continued)

(58) Field of Classification Search
CPC ............. H01L 23/66; H01L 2223/6677; H01L 2224/02379; H01Q 9/0407; H01Q 9/0478; H01Q 9/0442; H01Q 9/0414
See application file for complete search history.

(56) References Cited

U.S. PATENT DOCUMENTS 7,852,281 B2 12/2010 Choudhury
7,943,404 B2 5/2011 Ding
(Continued)

OTHER PUBLICATIONS

Tsai, C.H. et al., "Array Antenna Integrated Fan-out Wafer Level Packaging (InFO-WLP) for Millimeter Wave System Applications", 2013 IEEE International Electron Devices Meeting (IEDM), Dec. 2013, pp. 25.1.1.-25.1.4.

*Primary Examiner* — Jose R Diaz
(74) *Attorney, Agent, or Firm* — Duane Morris LLP

(57) ABSTRACT

A method for forming an integrated fan-out package includes depositing an adhesive layer on a carrier, forming a back-side buffer layer over the adhesive layer, forming a back-side redistribution metal layer on the back-side buffer layer, wherein the back-side redistribution metal layer includes one or more ground plane structures, forming one or more through-insulator vias (TIVs) and one or more cavity sidewalls on the one or more ground plane structures, placing a radio frequency (RF) integrated circuit (IC) die on the back-side buffer layer, laterally encapsulating the RF IC die, the one or more TIVs, the one or more cavity sidewalls, with a molding compound, thus forming an interim substrate, wherein the cavity sidewalls and their associated ground plane structure define one or more antenna cavities, and forming a top-side redistribution (RDL) wiring structure on the interim substrate, the top-side RDL wiring structure including one or more integrated patch antenna structure, wherein the one or more integrated patch antenna structure is coupled to the RF IC die and each of the one or more
(Continued)

integrated patch antenna structure is positioned over one of the antenna cavities.

20 Claims, 38 Drawing Sheets

Related U.S. Application Data continuation-in-part of application No. 13/481,974, filed on May 29, 2012, now Pat. No. 9,275,950.

(51) Int. Cl.
| | |
|---|---|
| *H01L 21/48* | (2006.01) |
| *H01L 23/522* | (2006.01) |
| *H01L 23/498* | (2006.01) |
| *H01L 23/538* | (2006.01) |
| *H01L 23/552* | (2006.01) |
| *H01L 23/528* | (2006.01) |
| *H01L 23/00* | (2006.01) |
| *H01L 21/56* | (2006.01) |

(52) U.S. Cl.
CPC .. *H01L 23/49822* (2013.01); *H01L 23/49827* (2013.01); *H01L 23/528* (2013.01); *H01L 23/5227* (2013.01); *H01L 23/5389* (2013.01); *H01L 23/552* (2013.01); *H01L 24/19* (2013.01); *H01L 24/20* (2013.01); *H01Q 9/0407* (2013.01); *H01L 21/568* (2013.01); *H01L 24/05* (2013.01); *H01L 24/11* (2013.01); *H01L 24/13* (2013.01); *H01L 24/29* (2013.01); *H01L 24/32* (2013.01); *H01L 24/73* (2013.01); *H01L 24/83* (2013.01); *H01L 24/92* (2013.01); *H01L 2223/6616* (2013.01); *H01L 2223/6677* (2013.01); *H01L 2224/0401* (2013.01); *H01L 2224/04105* (2013.01); *H01L 2224/05647* (2013.01); *H01L 2224/1146* (2013.01); *H01L 2224/11334* (2013.01); *H01L 2224/11849* (2013.01); *H01L 2224/12105* (2013.01); *H01L 2224/131* (2013.01); *H01L 2224/24137* (2013.01); *H01L 2224/2919* (2013.01); *H01L 2224/32225* (2013.01); *H01L 2224/73267* (2013.01); *H01L 2224/83005* (2013.01); *H01L 2224/83101* (2013.01); *H01L 2224/92244* (2013.01); *H01L 2924/14* (2013.01); *H01L 2924/1421* (2013.01); *H01L 2924/15311* (2013.01); *H01L 2924/18162* (2013.01)

(56) References Cited

U.S. PATENT DOCUMENTS

| | | |
|---|---|---|
| 8,269,671 B2 | 9/2012 | Chen et al. |
| 8,407,890 B2 | 4/2013 | Tang |
| 8,451,618 B2 | 5/2013 | Boeck et al. |
| 8,759,950 B2 | 6/2014 | Kamgaing |
| 9,431,369 B2 | 8/2016 | Chih |
| 9,496,593 B2 | 11/2016 | Dayan |
| 9,548,279 B2 | 1/2017 | Iida |
| 2010/0193935 A1 | 8/2010 | Lachner et al. |
| 2010/0219513 A1 | 9/2010 | Zhang et al. |
| 2013/0241059 A1 | 9/2013 | Boeck et al. |
| 2014/0110856 A1 | 4/2014 | Lin |
| 2014/0184460 A1 | 7/2014 | Yen |
| 2015/0048471 A1 | 2/2015 | Hasch et al. |
| 2015/0061148 A1 | 3/2015 | Li et al. |
| 2015/0069623 A1 | 3/2015 | Tsai et al. |
| 2015/0084814 A1* | 3/2015 | Rojanski ................. H01Q 1/42 342/368 |
| 2015/0102502 A1 | 4/2015 | Chiu et al. |
| 2015/0198662 A1 | 7/2015 | Wang et al. |
| 2015/0364830 A1* | 12/2015 | Tong ....................... H01Q 19/10 342/27 |

\* cited by examiner

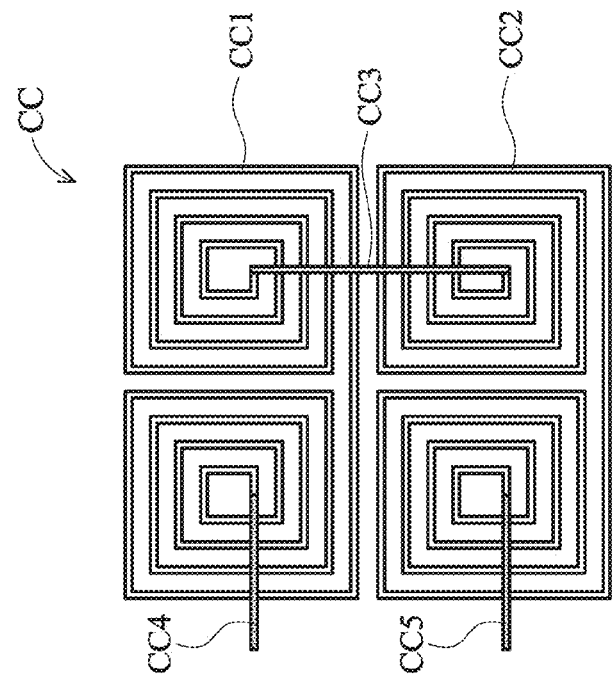
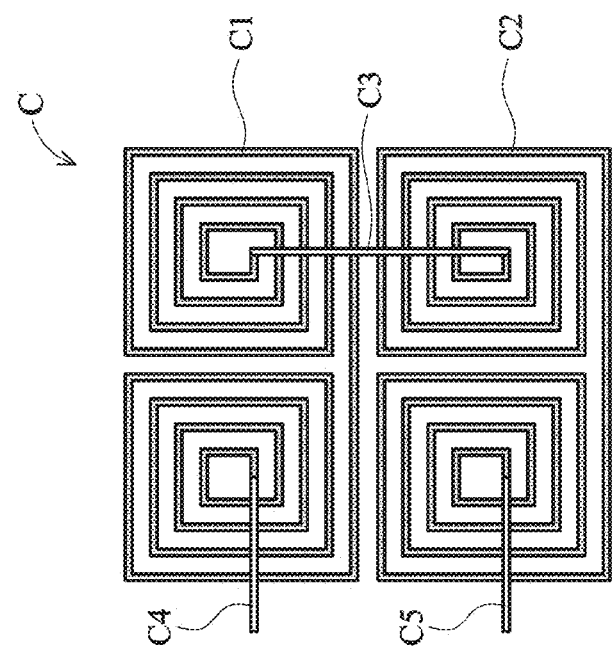
FIG. 5B
FIG. 5A

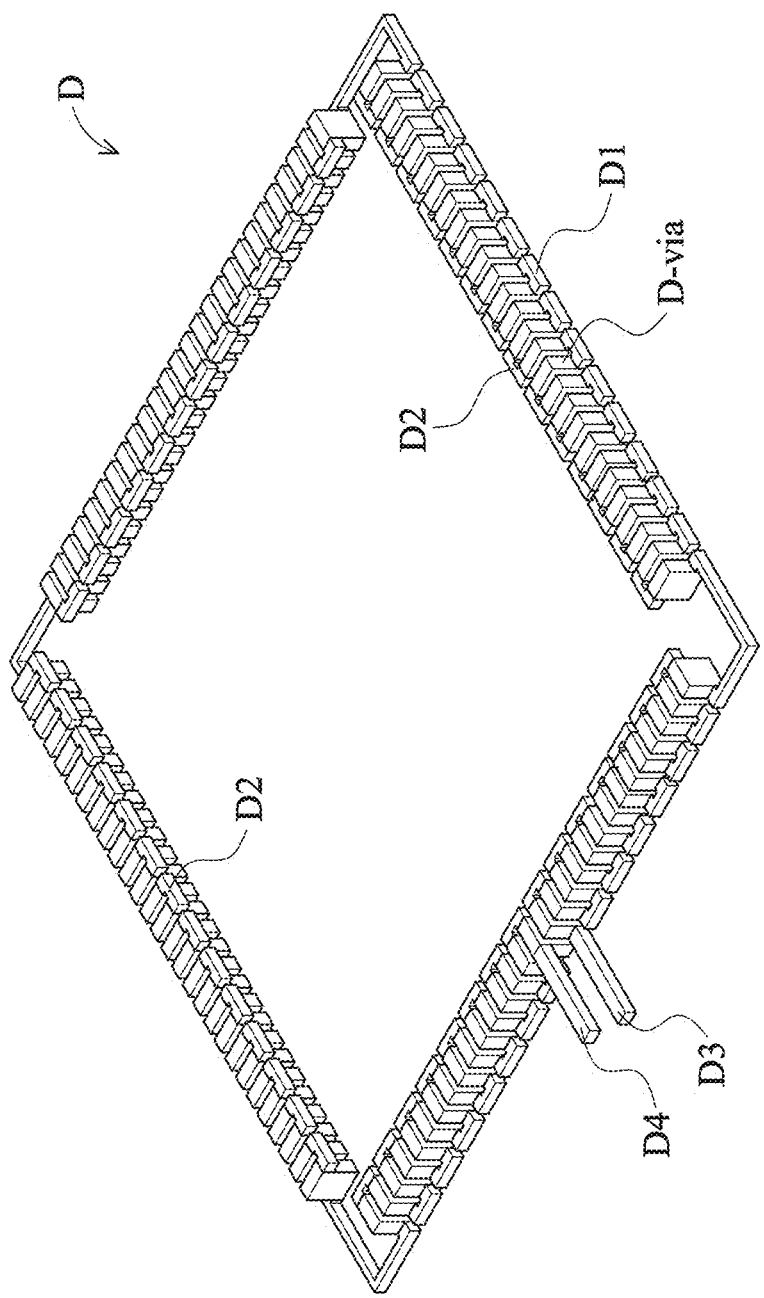

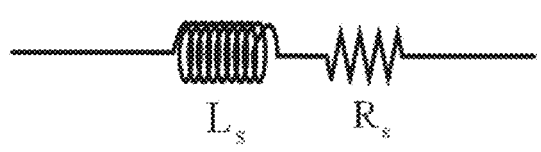
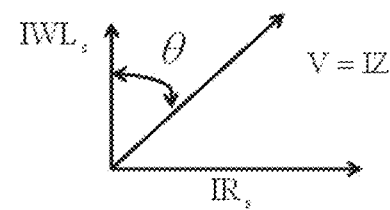
$Z = X_L + R_s$
$X_L = jWL_s$
$WL_s = WL_0 u_s'$
$R_s = WL_0 u_s''$
$\tan\theta = \dfrac{R_s}{WL_s} = \dfrac{u_s'}{u_s''}$
$L_o = \dfrac{4\pi V^2 \cdot 10^{-9}}{C_1}$
$L_o$ : core inductance
$C_1$ : Core factor
FIG. 12A
FIG. 12B

ANTENNA CAVITY STRUCTURE FOR INTEGRATED PATCH ANTENNA IN INTEGRATED FAN-OUT PACKAGING

CROSS-REFERENCE TO RELATED APPLICATION

This is a divisional application of U.S. patent application Ser. No. 15/056,030, filed on Feb. 29, 2016, which is a continuation-in-part of co-pending U.S. patent application Ser. No. 13/481,974, filed on May 29, 2012, now U.S. Pat. No. 9,275,950, issued on Mar. 1, 2016, which is incorporated by reference herein in its entirety.

FIELD

The present disclosure generally relates to a bead element employed in integrated circuit packaging.

BACKGROUND

Low Temperature Co-Fired Ceramic (LTCC) and printed circuit board (PCB) substrates can be used for integration of mm-wave antennas with RF integrated circuits (ICs) in high frequency applications but those packages have power consumption issues resulting from interconnect losses from chip to antenna through solder bumps or balls. Therefore, improved antenna structures integrated into packaging is desired.

BRIEF DESCRIPTION OF THE DRAWINGS

FIGS. 5A and 5B show two-layer metal wiring beads embodiments according to some embodiments.

FIGS. 6A and 6B show a two-layer metal wiring bead according to some embodiments.

FIG. 12A and 12B illustrate the relationship between the parameters Z, R, and XL (impedance, resistance, and reactance) according to some embodiments.

Figure 1:
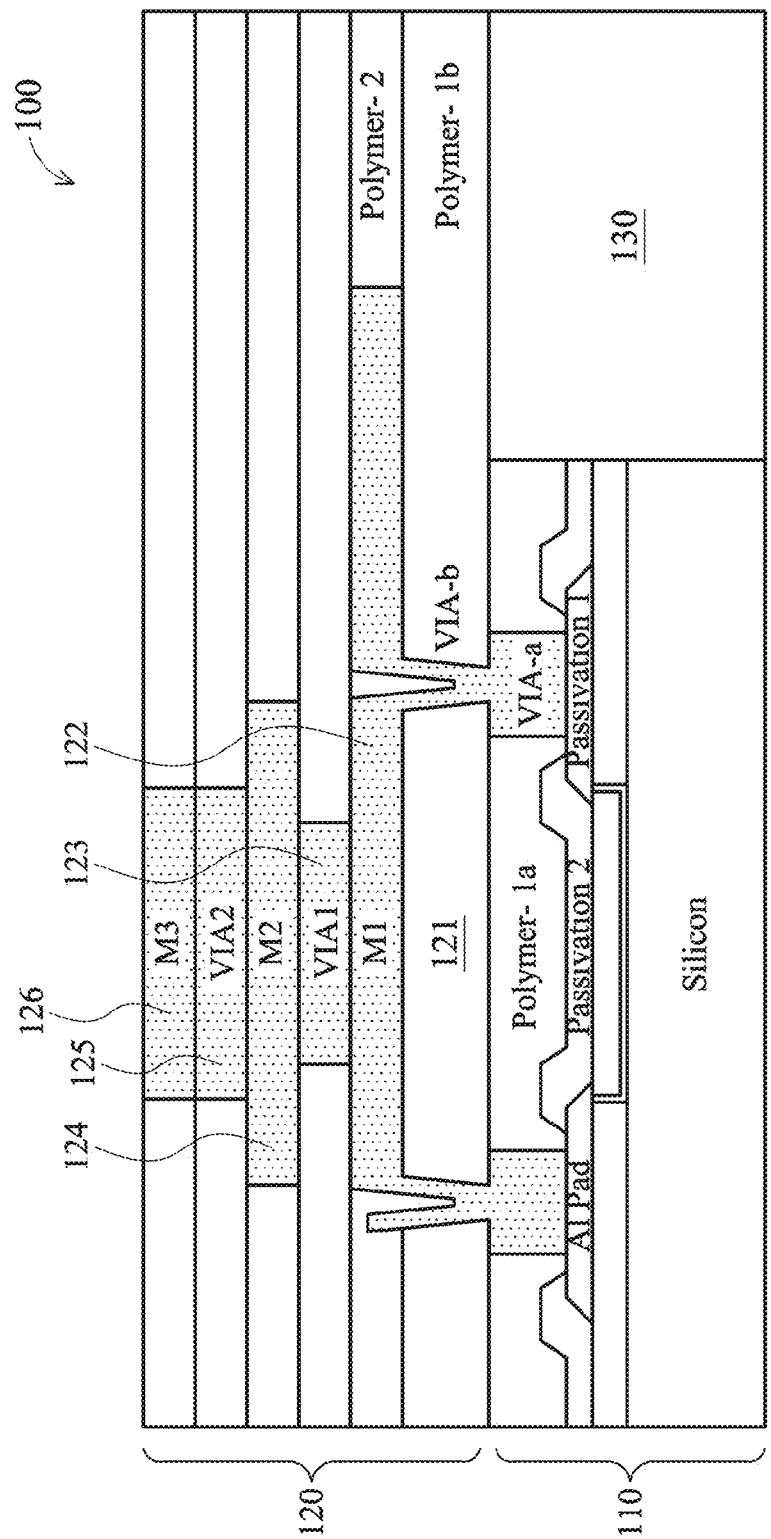
FIG. 1 is a cross-sectional view illustration of a portion of a 2.5D/3D IC package in which one or more of the metal wiring bead of the present disclosure can be incorporated according to some embodiments.

All drawings are schematic and are not to scale.

DETAILED DESCRIPTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Some embodiments of the present disclosure relate to an impedance element, in particular, relates to an element which is used as a bead filter or a noise filter to eliminate power noise and suppress electromagnetic interference in integrated circuit (IC) devices.

Some embodiments of this disclosure include a multilayer interposer structure for 2.5D/3D applications that eliminates different power noise and suppress electromagnetic interference. Integrated fan-out (InFO) packages can be integrated with antenna structures such as patch antennas that are coupled to an RF IC die through a feed structure that is directly connected to the RF IC die. For example, one or more antenna can be integrated with the RF IC die through an integrated fan-out redistribution structures comprising a metallization layer (e.g. a redistribution layer) coupled to a package molding compound with the RF IC die embedded therein. As the advancing RF applications require increasingly higher frequency RF transceiver capabilities, improved InFO packages can meet higher frequency RF transceiver specifications.

Disclosed herein is a method for eliminating different power noise and suppressing electromagnetic interference (EMI) in 2.5D/3D integrated circuit (IC) packages used in communication system applications. According to an embodiment, one or more convoluted metal wiring beads having a convoluted shape are incorporated into the wiring structures of the multilayer interposer of a 2.5D/3D IC package. The convoluted metal wiring bead can be incorporated into the power lines in the IC package and function as a bead filter or a noise filter to eliminate power line noise. The metal wiring bead is configured to provide an appropriate impedance to meet the power noise reduction requirement of a particular IC package's requirement. Unlike many conventional impedance elements that are implemented as ferrite beads or discrete surface-mount devices such as ferromagnetic insulation chips, incorporating the impedance element into the multilayer interposer structure provides more compact solution and lower cost.

FIG. 1 is a cross-sectional view illustration of a portion of a 2.5D/3D IC package 100 in which one or more of the metal wiring bead of the present disclosure can be incorporated. The IC package 100 comprises an IC device 110 and an interposer 120 attached to the IC device. Generally, the IC device 110 can be encapsulated with a molding compound 130.

The interposer 120 comprises a multiple layers of wiring structures. In this example interposer 120, the multiple layers of wiring structures comprise a plurality of wiring layers 122, 124, and 126 and via layers 121, 123 and 125. The wiring layers 122, 124, and 126 each comprises various wiring structures formed from conductor materials M1, M2, M3, corresponding to the wiring layers 122, 124, 126 respectively, disposed in a dielectric material. The via layers 121, 123 and 125 each comprises a plurality of vias generally referred to herein as V1, V2, V3, respectively, disposed in a non-ferrite polymeric dielectric material. The vias provide the electrical connection between the wiring layers. The vias V1 in the first via layer 121 provide the electrical connection between the wiring structures of the first wiring layer 122 and the IC device 110. Generally, the conductor materials M1, M2, M3 are copper-based metal and the dielectric material is one or more types of polymers. The conductor materials M1, M2, and M3 generally are the same materials but they can be different.

According to an embodiment of the present disclosure, the metal wiring bead is provided in the interposer 120 of the IC package 100. The metal wiring bead can comprise a single layer pattern, a two-layer pattern or a three-layer pattern and can be formed in one or more of the plurality of metal wiring layers 122, 124, and 126.

Figure 2:
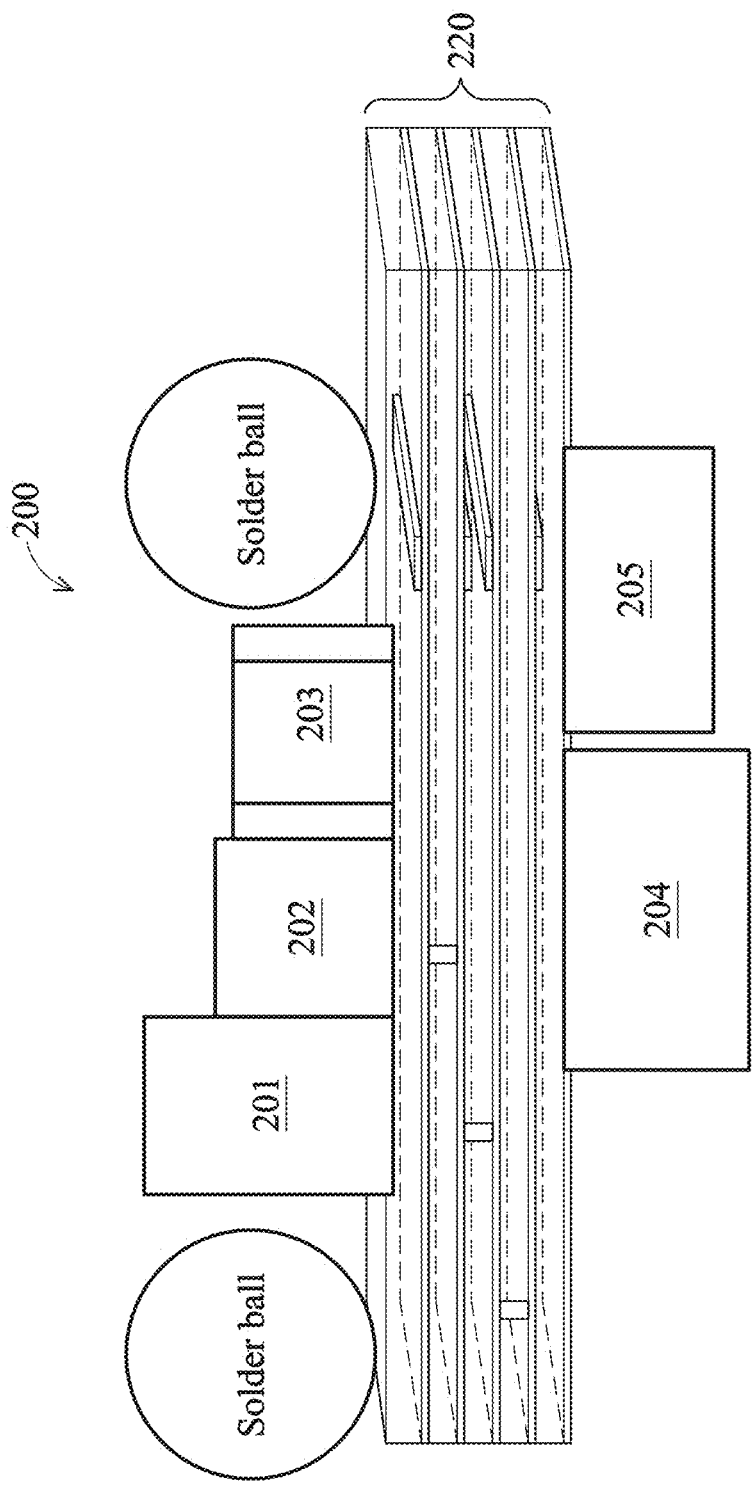
FIG. 2 is an illustration of an example of a 2.5D IC package in which one or more of the metal wiring bead according to some embodiments of the present disclosure can be incorporated.

FIG. 2 is a schematic illustration of an example of a 2.5D IC package 200 in which one or more of the metal wiring bead of the present disclosure can be incorporated. The IC package 200 comprises an interposer 220 to which one or more IC devices 201, 202, and 203 are attached on one side and one or more IC devices 204 and 205 are attached on the second side. One or more of the metal wiring bead of the present disclosure can be incorporated in the interposer 220.

Figure 3:
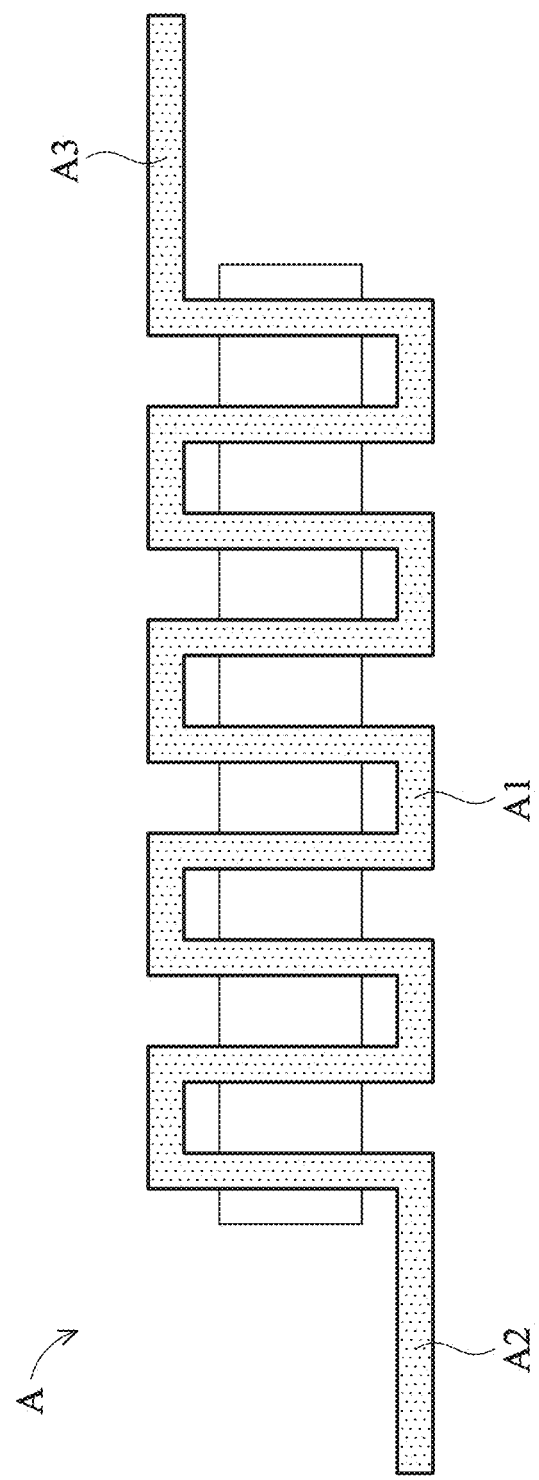
FIG. 3 shows a one-layer metal wiring bead according to some embodiments.

FIG. 3 shows a one-layer embodiment of a metal wiring bead A according to an aspect of the present disclosure. The metal wiring bead A has a convoluted wiring pattern that is formed in one of the three wiring layers 122, 124 or 126 from the corresponding M1, M2 or M3 conducting material. The convoluted wiring pattern of the metal wiring bead A has a serpentine-like portion A1 that begins at first terminal segment A2 and ends at a second terminal segment A3. The serpentine-like portion A1 is a wiring trace of the conductor material provided in a meandering serpentine-like pattern. The two terminal segments A2 and A3 provide electrical connection to the functional power lines in the IC package. The term "serpentine-like" is used to describe the generally winding shape represented by the portion A1 where the metal wiring is winding back and forth similar to the shape formed by the body of a moving serpent.

Figure 4:
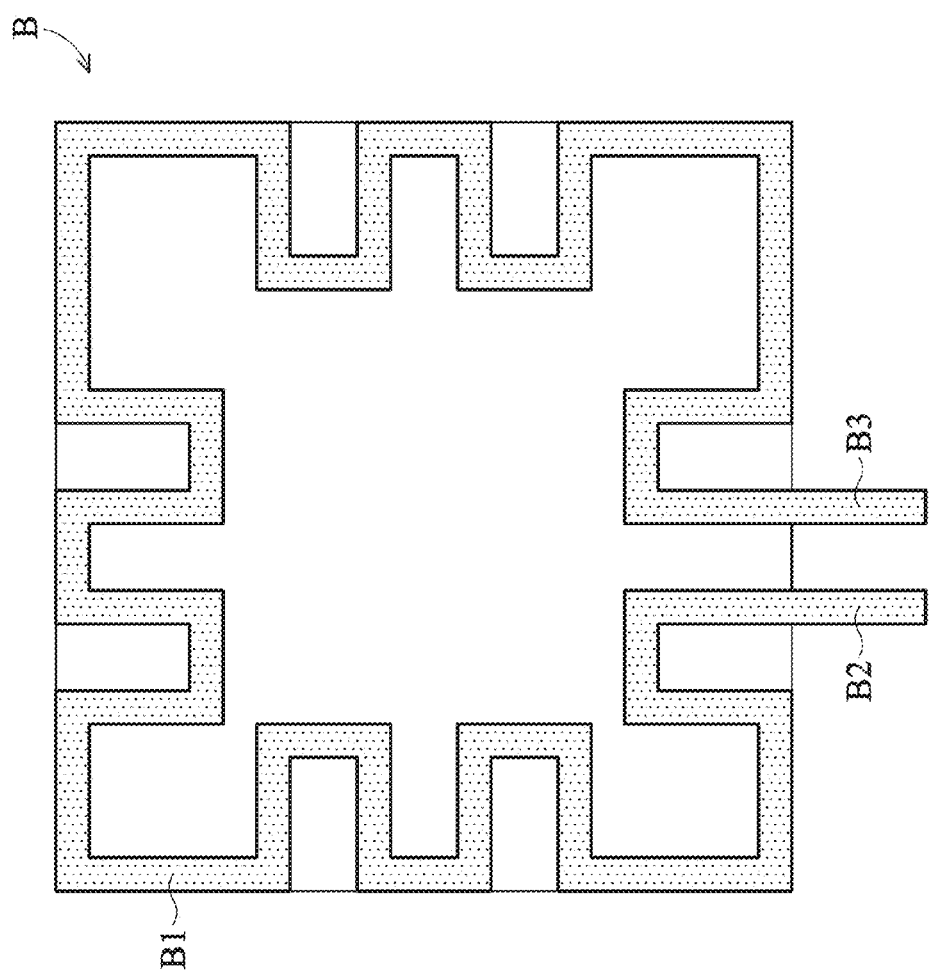
FIG. 4 shows a one-layer metal wiring bead according to some embodiments

FIG. 4 shows another one-layer embodiment of a metal wiring bead B. The metal wiring bead B has a convoluted wiring pattern that is formed in one of the three wiring layers 122, 124 or 126 from the corresponding M1, M2 or M3 conducting material. Unlike the metal wiring bead A shown in FIG. 3, the convoluted wiring pattern of the metal wiring bead B has a meandering loop portion B1 that begins at a first terminal segment B2, follows a square or quadrilateral outline and loops back towards the first terminal segment and ends at a second terminal segment B3. The conductive line tracing in the meandering loop portion B1 meanders in right angles, but the meandering pattern of the conductive line trace can be in any shape. The two terminal segments B2 and B3 are connected to the functional power lines in the IC package.

FIG. 5 shows two-layer metal wiring bead embodiments C and CC. The metal wiring bead C has a convoluted wiring pattern that has two convoluted segments C1 and C2 formed from the M1 conducting material in the first wiring layer 122 that are electrically connected in series by the connecting segment C3 that is formed from the M2 metal in the second metal wiring layer 124. Two terminal segments C4 and C5 provide the electrical connection to the functional power lines for the IC package. The terminal segments C4 and C5 are also formed from the M2 conducting material in the second metal wiring layer 124. Corresponding via structures (not shown) in the via layer 123 connects the convoluted segments C1 and C2 to the segments C3, C4 and C5.

The metal wiring bead CC has a convoluted wiring pattern that has two convoluted segments CC1 and CC2 formed from the M2 conducting material in the second wiring layer 124 that are connected in series by the connecting segment CC3 that is formed from the M1 conducting material in the first metal wiring layer 121. Two terminal segments CC4 and CC5 provide the electrical connection to the functional power lines for the IC package. The terminal segments CC4 and CC5 are also formed from the M1 conducting material in the first metal wiring layer 122. Corresponding via structures (not shown) in the via layer 123 connects the convoluted segments CC1 and CC2 to the segments CC3, CC4 and CC5. Because FIG. 4 is a plan view of the metal wiring beads C and CC, the via structures connecting the M1 conducting material structures with the M2 conducting material structures would be oriented orthogonal to the plane of the drawings and hidden between the connecting parts of the M1 and M2 conducting material structures.

Figure 6A:
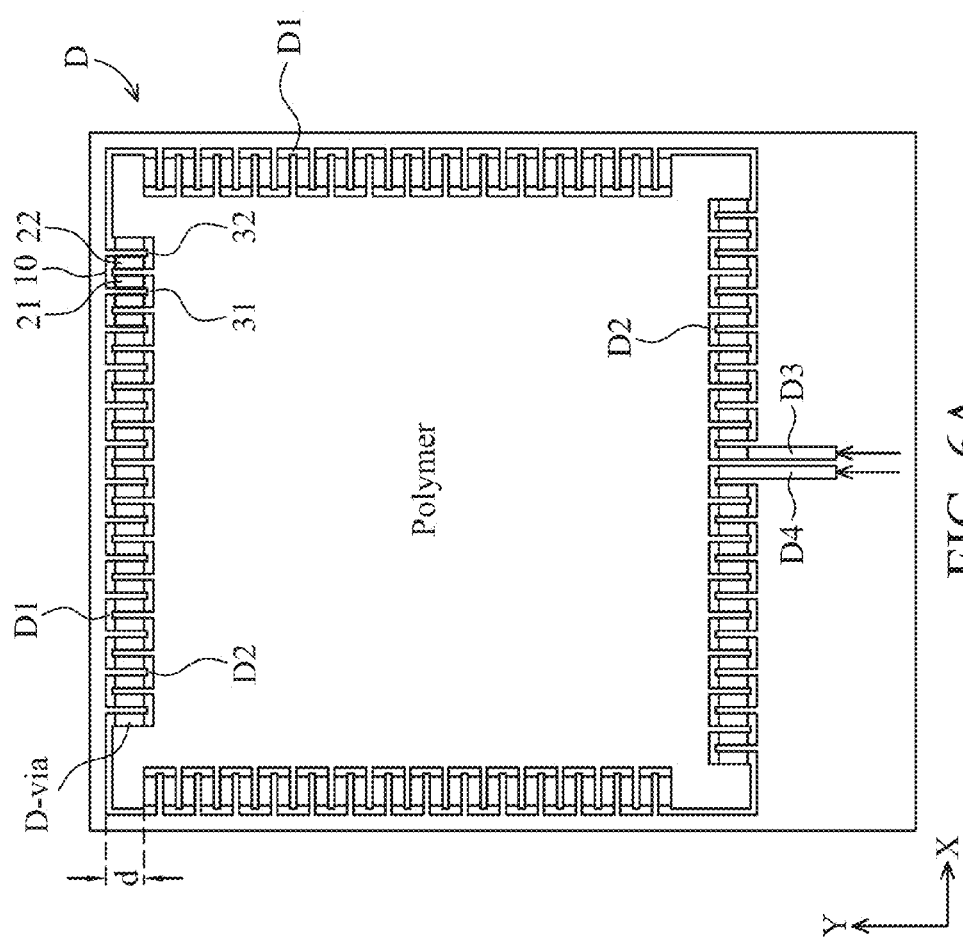

FIGS. 6A and 6B show another two-layer metal wiring bead embodiment D. The metal wiring bead D has a convoluted wiring pattern having a quadrilateral outline that has a first set of a plurality of line segments D1 formed from the M1 conducting material in the first wiring layer 122 and a second set of a plurality of line segments D2 formed from the M2 conducting material in the second wiring layer 124. A plurality of vias D-via in the via layer 123 provide the electrical connection between the first set of line segments D1 and the second set of line segments D2 and form a serpentine-like convoluted pattern for the metal wiring bead D. The first set of line segments D1 and the second set of line segments D2 are in a staggered arrangement as shown and the vias D-via connect each of the line segments in the first set D1 and the second set D2 to two line segments in the other set. For example, referring to FIG. 6A, the line segment 10 in the first set D1 is connected to two of the line segments 31 and 32 in the second set D2 by the vias 21 and 22. The same is true for the line segment 12 located at the corner of the square-shaped outline of the metal wiring bead D. The only difference is that the line segment 12 has a bend in the middle of the segment to form the corner section of the metal wiring bead D. The vias D-via are configured to extend not only in the Z-direction (i.e., the direction orthogonal to the plane of the wiring layers) but also extend along the direction parallel to the plane of the wiring layers. In the illustrated example of vias 21 and 22, they extend along Y-direction for a distance of d to make the connection between the line segment 10 and the line segments 31 and 32. Two terminal segments D3 and D4 provide the electrical connection to the functional power lines for the IC package. The terminal segment D3 is formed from the M1 conducting material in the first wiring layer 122 and the terminal segment D4 is formed from the M2 conducting material in the second wiring layer 124. FIG. 5B shows an isometric view illustration of the metal wiring bead D.

Figure 7A:
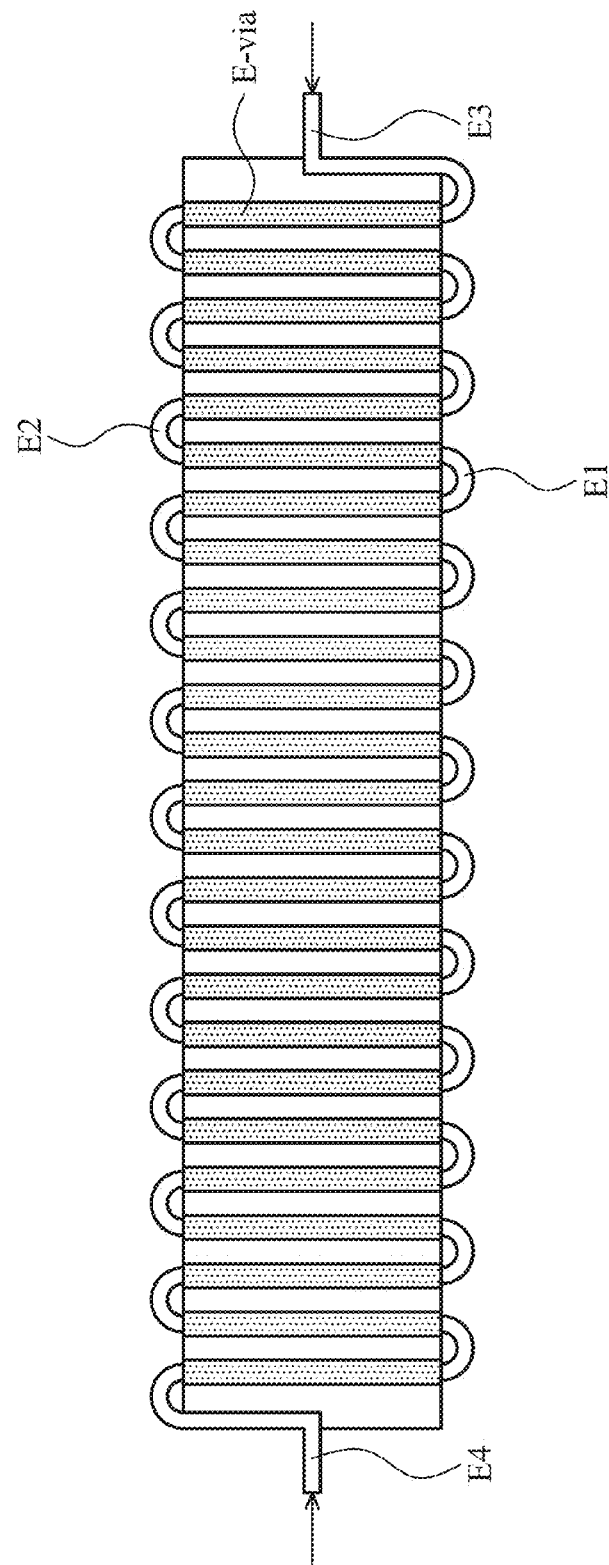
FIGS. 7A and 7B show a two-layer metal wiring bead according to some embodiments.
Figure 7B:
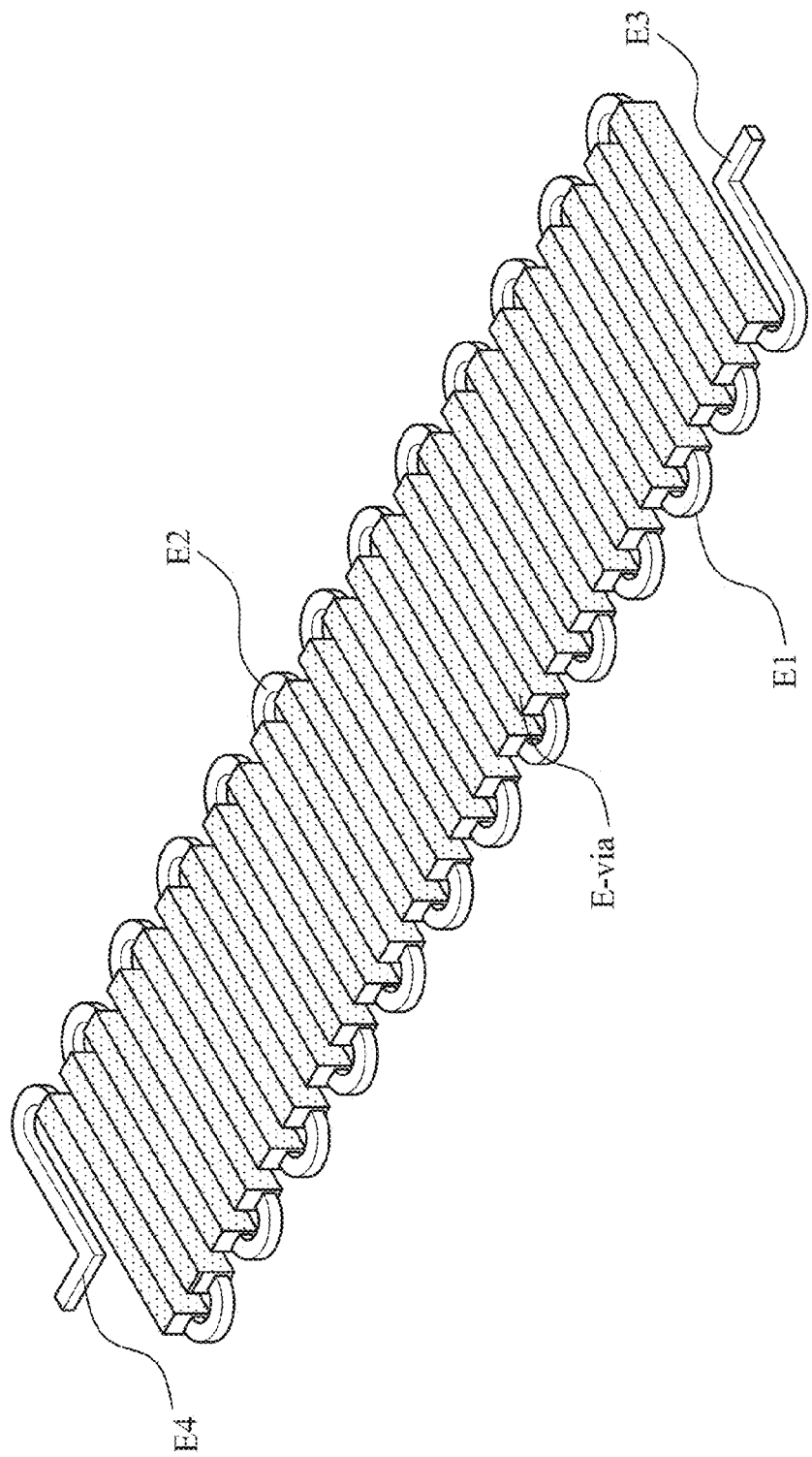

FIGS. 7A and 7B show another two-layer metal wiring bead embodiment E. The metal wiring bead E has a convoluted wiring pattern that forms a serpentine-like that has a first set of a plurality of line segments E1 formed from the M1 conducting material in the first wiring layer 122 and a second set of a plurality of line segments E2 formed from the M2 conducting material in the second wiring layer 124. A plurality of vias E-via in the via layer 123 provide the electrical connection between the first set of line segments E1 and the second set of line segments E2 and form a serpentine-like convoluted pattern for the metal wiring bead E. The vias E-via extend at least 100 µm along the X or Y direction within the via layer (i.e. the directions parallel to the plane of the wiring layers), thereby comprising a substantial portion of the total length of the metal wiring bead E. In one embodiment, the extended vias comprise at least 50% of the total length of the metal wiring bead E. The first and second sets of line segments E1 and E2 have a curved configuration rather than being straight line segments. Two terminal segments E3 and E4 provide the electrical connection to the functional power lines for the IC package.

Figure 8:
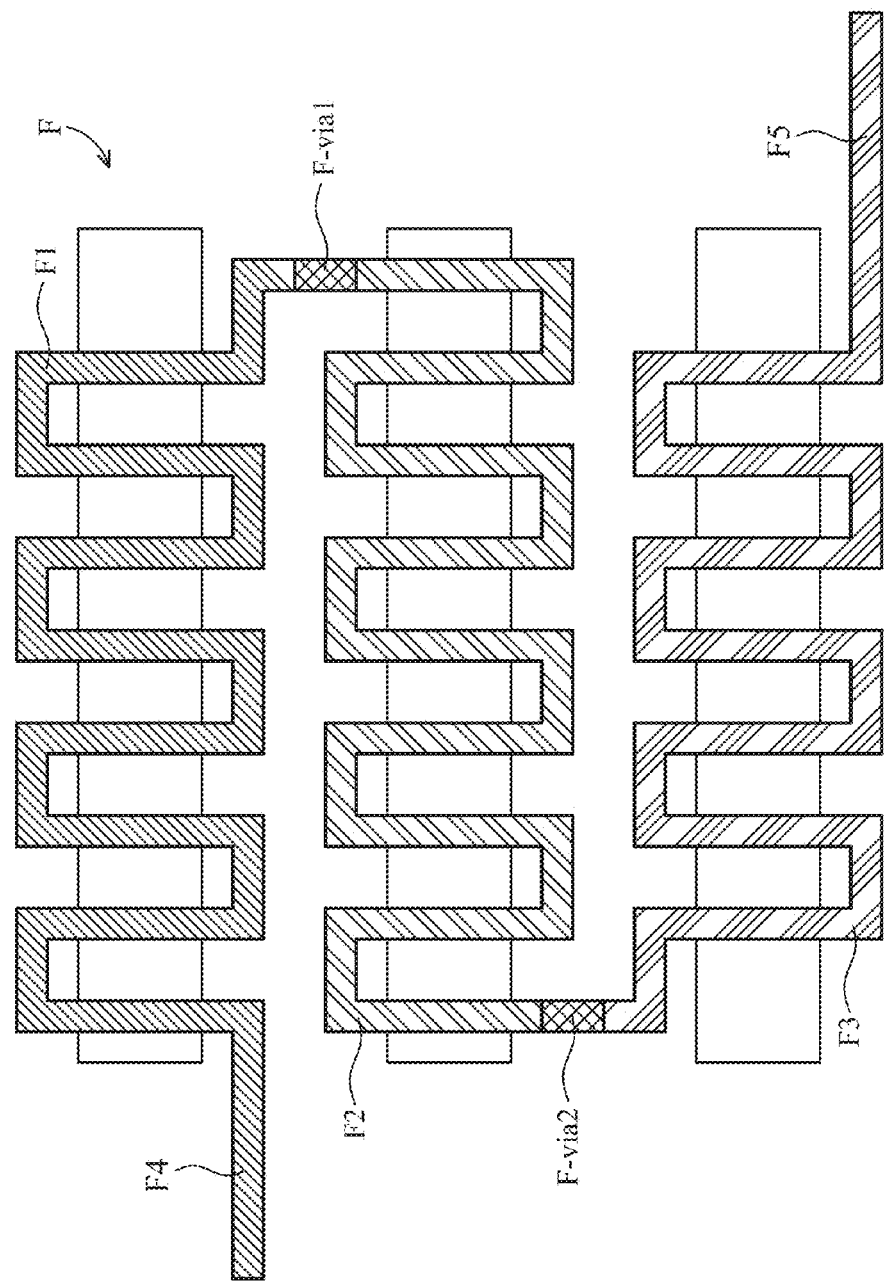
FIG. 8 shows a three-layer metal wiring bead according to some embodiments.

FIG. 8 shows a three-layer metal wiring bead embodiment F according to an aspect of the present disclosure. The metal wiring bead F comprises a convoluted wiring pattern that forms a serpentine-like structure in each of the three wiring layers 122, 124, and 126 that are electrically connected in series. In the first wiring layer 122, a first serpentine-like portion F1 is formed from the M1 conductor material. In the second wiring layer 124, a second serpentine-like portion F2 is formed from the M2 conductor material. In the third wiring layer 126, a third serpentine-like portion F3 is formed from the M3 conductor material. The electrical connection between the first serpentine-like portion F1 and the second serpentine-like portion F2 is provided by a via F-vial provided in the via layer 123. The electrical connection between the second serpentine-like portion F2 and the third serpentine-like portion F3 is provided by a via F-via2 provided in the via layer 125. Two terminal segments F4 and F5 provide the electrical connection to the functional power lines for the IC package.

Figure 9:
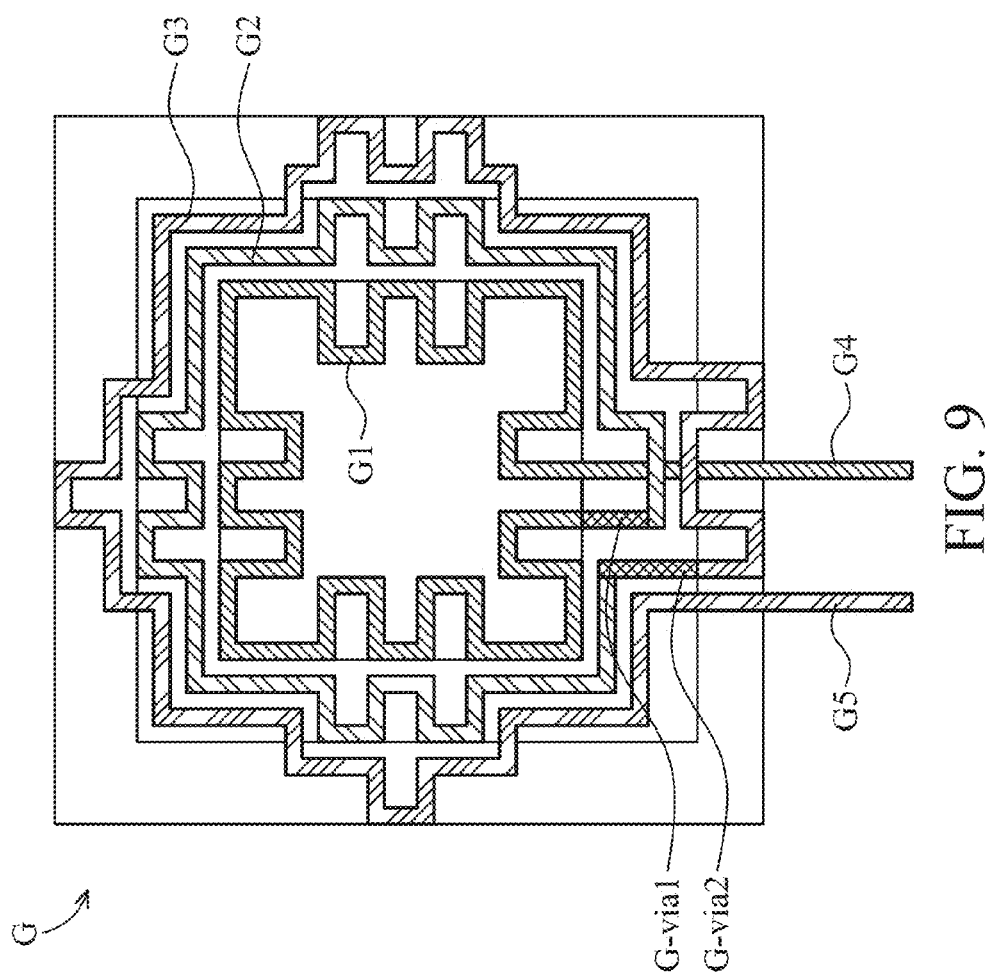
FIG. 9 shows another three-layer metal wiring bead according to some embodiments.

FIG. 9 shows another three-layer metal wiring bead embodiment G according to another aspect of the present disclosure. The metal wiring bead G comprises a convoluted wiring pattern in each of the three wiring layers 122, 124, and 126 that are electrically connected in series. In the first wiring layer 122, a first convoluted wiring pattern G1 is formed from the M1 conductor material. In the second wiring layer 124, a second convoluted wiring pattern G2 is formed from the M2 conductor material. In the third wiring layer 126, a third convoluted wiring pattern G3 is formed from the M3 conductor material. The electrical connection between the first convoluted wiring pattern G1 and the second convoluted wiring pattern G2 is provided by a via G-vial provided in the via layer 123. The electrical connection between the second convoluted wiring pattern G2 and the third convoluted wiring pattern G3 is provided by a via G-via2 provided in the via layer 125. Two terminal segments G4 and G5 provide the electrical connection to the functional power lines for the IC package. As shown, the three convoluted wiring patterns G1, G2, and G3 have different size outlines, the first convoluted wiring pattern G1 having the smallest outline and the third convoluted wiring pattern G3 having the largest so that the second and the first convoluted wiring patterns G2 and G1 are nested within the outline of the third convoluted wiring pattern G3 when viewed from the top as shown in FIG. 8. This configuration is another example that provides sufficient metal length for the metal wiring bead G which will provide proper R (resistance) and XL (reactance) values for the bead.

Figure 10:
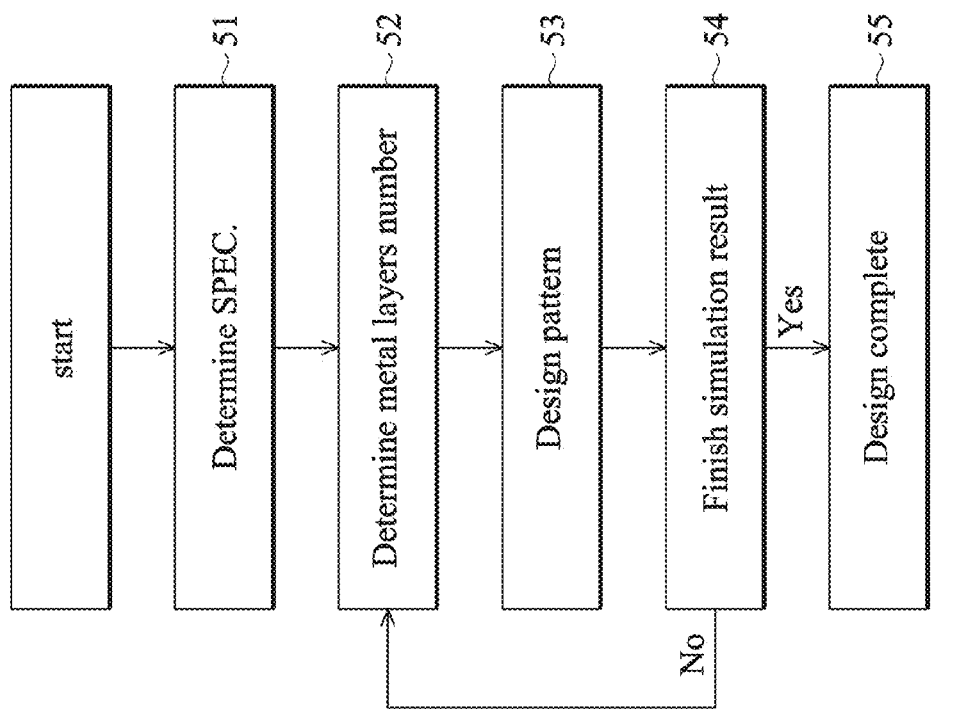
FIG. 10 is a flow chart for a method for providing the metal wiring bead according to some embodiments.

FIG. 10 shows a flow chart of a method for providing the metal wiring bead according to an embodiment. First, based on a performance requirement defined for a particular IC package, the corresponding impedance specification for the metal wiring bead is determined. (See block 51). This is referred to herein as the desired impedance value. Then, a determination is made as to whether one, two or three layers of metal should be used to make the metal wiring bead for the particular IC package that will produce the desired impedance. (See block 52). One determines whether one, two or three layers of metal should be used depending on the metal wiring bead impedance value that is desired in a given application. Next, a determination is made as to the wiring pattern (e.g. a square, circle, etc.) of the metal wiring bead for the particular IC package that will produce the desired impedance. (See block 53). The particular wiring pattern is chosen that would provide the desired wiring bead impedance value. Before the design for the metal wiring bead is finalized and implemented into the manufacturing process for the interposer for the IC package, a computer simulation is conducted to verify whether the specified impedance is met by the determined number of metal layers and the wiring pattern for the metal wiring bead. (See block 54).

If the results of the simulation shows that the desired impedance value is not achieved by the particular metal wiring bead design parameters, then the steps identified in the blocks 52, 53 and 54 are repeated until a metal wiring bead design parameters with the desired impedance value is achieved. If the results of the simulation shows that the desired impedance value is achieved by the particular metal wiring bead design parameters, the simulation is complete and the design parameters can be incorporated into the manufacturing design data for the interposer for a 2.5D/3D IC package.

Figure 11:
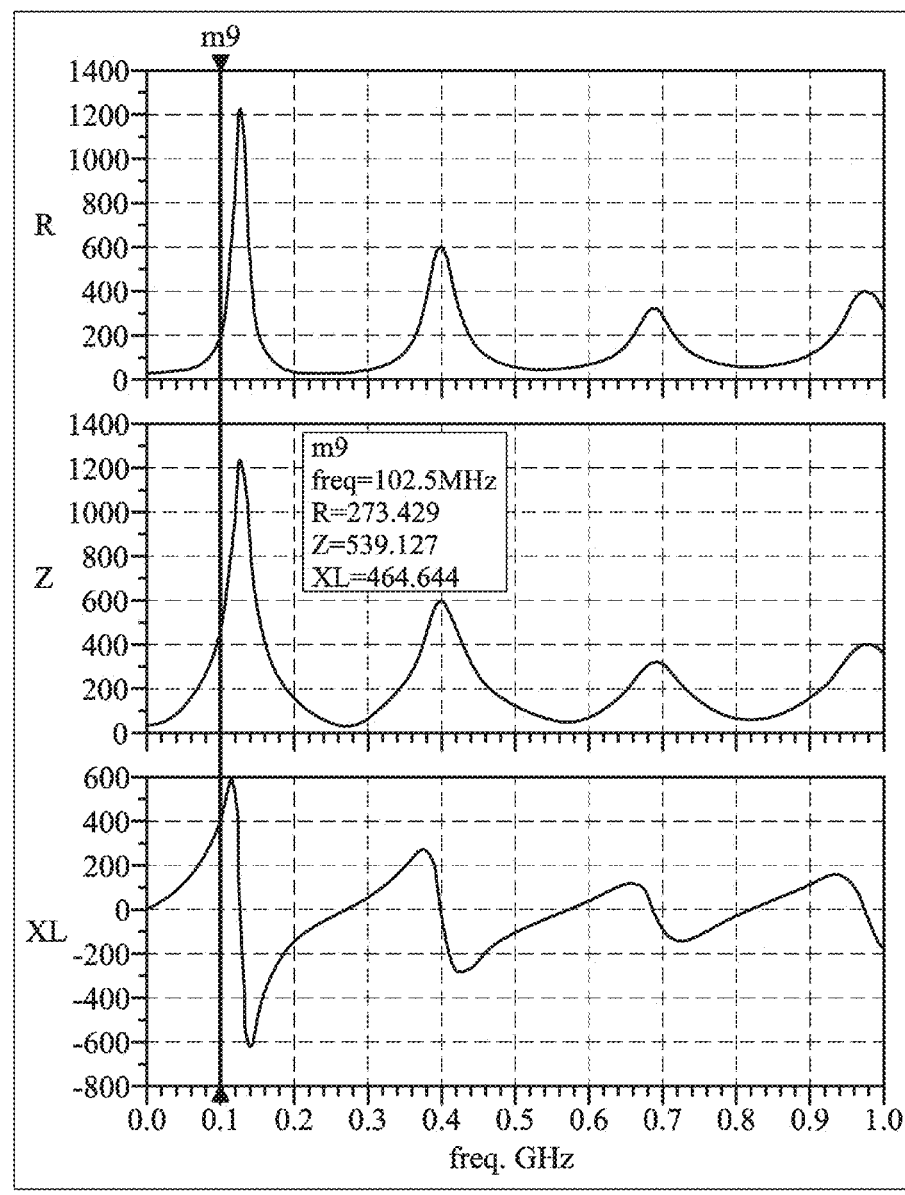
FIG. 11 shows plots of R, XL, Z performance values from a simulation of a metal wiring bead according to some embodiments of the present disclosure.

FIG. 11 shows plots of Z, R, and XL (impedance, resistance, and reactance) values at 102.5 MHz from a simulation of a metal wiring bead according to the present disclosure. The general relationship between the parameters Z, R, and XL used for such simulation calculations is well known in the art and is represented by the illustrations in FIGS. 12A and 12B.

The bead element of the present disclosure can be employed in IC packages and in particular, to a multilayer interposer structure for 2.5D/3D multi-chip packaging technologies to eliminate or substantially reduce different power noise and suppress electromagnetic interference in communication system applications.

Integrated fan-out (InFO) packages, also known as integrated fan-out wafer level package (InFO-WLP), have become popular in recent times. In an InFO package, fan out wirings between input/output (I/O) pins on the die and package I/O pins can be formed in a redistribution layer (RDL) over the die. The die is surrounded laterally by a medium, such as a molding compound, encapsulant, epoxy resin, or the like. The RDL can extend laterally beyond the perimeter of the die. The RDL layer comprises a patternable dielectric material, in which conductive patterns and conductive vias can be formed. InFO packages can provide significantly thinner packages with much tighter redistribution line pitches (10 µm) compared to other fan-out structures for die packaging technologies. InFO packages provide many advantages over packages such as FC-BGA (flip-chip ball grid array) packaging since passive devices such as inductors and capacitors can be formed beyond the perimeter of an IC die (e.g., over molding compound) for lower substrate loss and higher electrical performance. The smaller die form factor also leads to better thermal performance and thus a lower operating temperature for the same power budget. Alternatively, by taking advantage of the improved thermal performance, faster circuit operation speed can be achieved for the same temperature profile as FC-BGA.

According to some embodiments of the present disclosure, an InFO package having one or more integrated patch antenna is provided, where each integrated patch antenna incorporates an insulator filled antenna cavity structure for improved antenna performance and efficiency at high frequency applications.

The antenna cavity structure provided according to some embodiments of the present disclosure may improve the reflection coefficient, the S11 parameter, of the integrated patch antenna in the InFO package, especially in high frequency applications that employ antenna efficiency at frequencies of 5.8 GHz and higher. The antenna cavity structure also helps reduce the undesirable couplings of the antenna to the nearby circuits, and prevent the unwanted noise from the circuits from reaching the antenna.

The embodiments described below provide many applicable concepts that can be embodied in a wide variety of specific contexts. The specific embodiments discussed are illustrative, and do not limit the scope of the disclosure.

A description of an InFO package and a method of forming the same are provided in accordance with some embodiments. The intermediate stages of forming the InFO package are illustrated. Throughout the various views and illustrative embodiments, like reference numbers are used to designate like elements.

Figure 13:
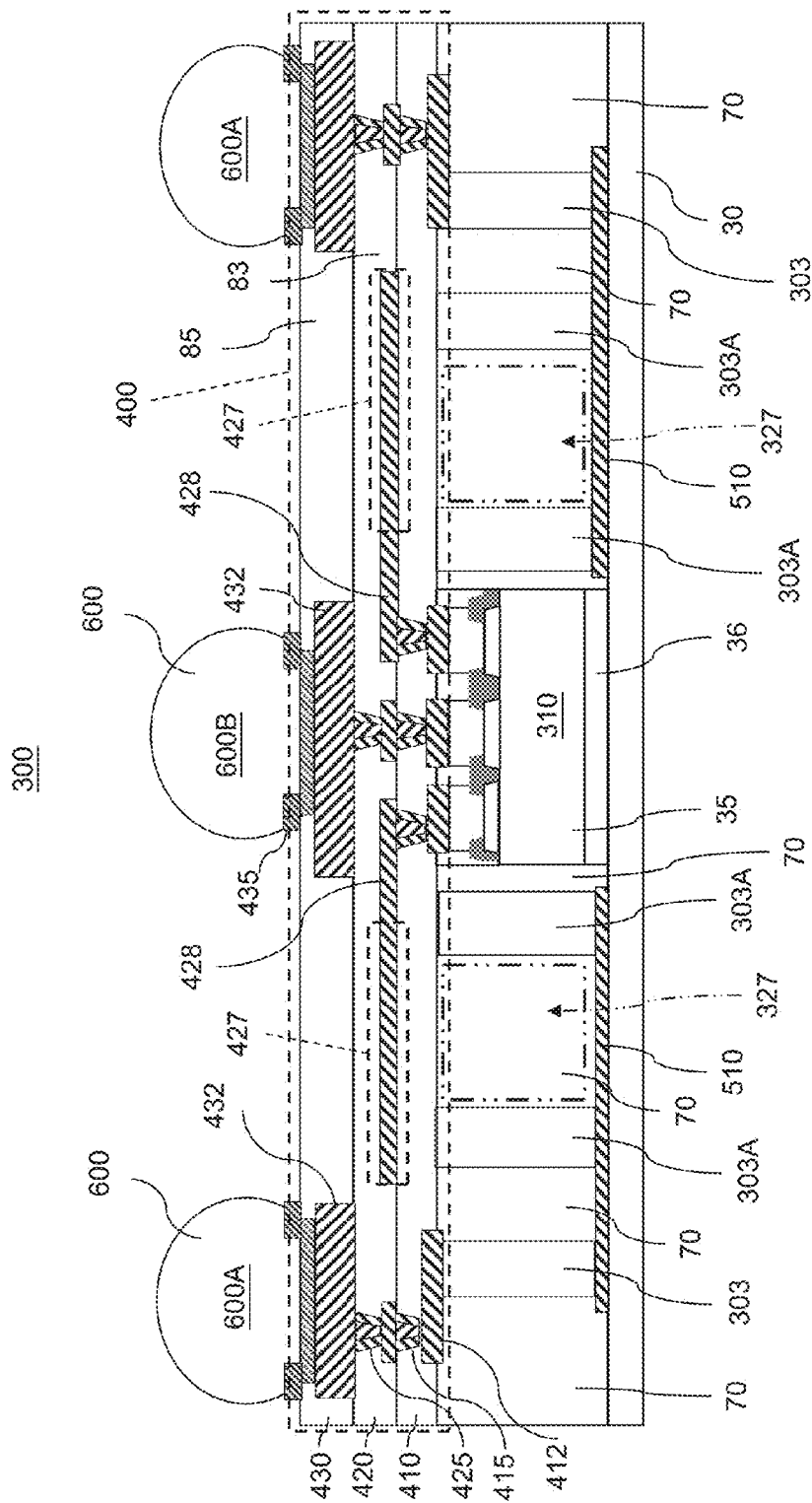
FIG. 13 is a cross-sectional view of an exemplary InFO package according to some embodiments of the present disclosure, where the cross-section is taken through the section line A-A shown in FIG. 14.

In some embodiments, as shown in FIG. 13, an InFO package 300 comprises: a top-side redistribution wiring structure 400; a back-side redistribution wiring layer 500; a ground plane 510 provided in the back-side redistribution wiring layer; a molding compound layer 70 having a thickness and provided between the back-side redistribution wiring layer and the top-side redistribution wiring structure; an RF integrated circuit die 310 at least laterally embedded within the molding compound layer; one or more integrated patch antenna structure 427 provided in the top-side redistribution wiring structure, wherein the one or more integrated patch antenna structure is coupled to the RF integrated circuit die and configured to radiate electromagnetic radiation for wireless transmission or to receive electromagnetic radiation for wireless reception; one or more cavity sidewall structures 303A provided within the molding compound layer and in electrical contact with the ground plane 510 and extending from the ground plane through the thickness of the molding compound layer 70; and an antenna cavity 327 provided within the molding compound layer under each of the one or more integrated patch antenna structure, wherein each of the antenna cavity is defined by a cavity sidewall structure and the ground plane and the antenna cavity is filled with the molding compound.

In some embodiments of the InFO package 300 one or more ground plane structures 510 are provided and each of the antenna cavity is defined by a cavity sidewall structure and one of the at least one or more ground plane structures.

FIG. 13 is a cross sectional view of an embodiment of an InFO package 300 according to an aspect of the present disclosure. The cross-section is taken through the section line A-A shown in the top-down view of the InFO package illustrated in FIG. 14. InFO packages such as the InFO package 300 can have a plurality of integrated circuit (IC) dies. FIG. 13 shows a portion of InFO package 300 containing an RF IC die 310.

Figure 19:
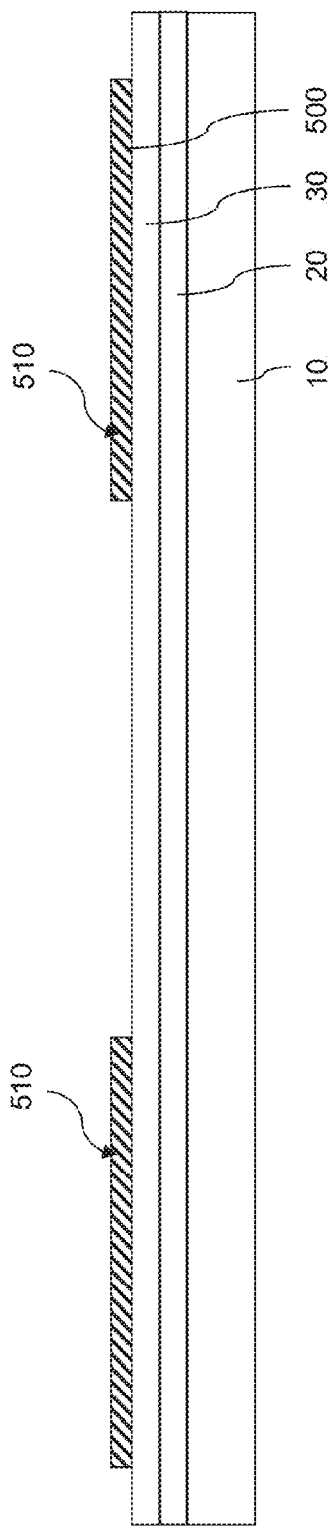

The RF IC die 310 is embedded in a medium, such as a molding compound 70. The bottom side of the RF IC die 310 has a back-side redistribution layer RDL 500 (FIG. 19) that can contain one or more conductor structures, such as conductor 510. On the top-side of the RF IC die 310, a top-side redistribution wiring structure 400 is provided. The RDL wiring patterns can include wiring patterns at least partially over the RF IC die 310 and/or wiring patterns at least partially over the molding compound 70 material. The top-side redistribution wiring structure 400 generally comprises a plurality of redistribution layers each comprising a plurality of conductor structures. The top-side redistribution wiring structure 400 provides electrical connection between the RF IC die 310 and the interconnection structures such as the solder bumps 600 on the top-side of the InFO package 300. The solder bumps 600 provide electrical interconnection to the next level packaging such as, for example, a printed circuit board (PCB) or an interposer.

The conductor structures 510 in the back-side redistribution layer 500 can also be electrically conductively connected to the interconnection structures such as the solder bumps 600 on the top-side of the InFO package 300 through the top-side redistribution wiring structure 400. The electrical connection between the conductor structures 510 in the back-side redistribution layer 500 and the top-side redistribution wiring structure 400 can be provided by one or more of through-insulator vias (TIVs), also known as through-InFO vias, 303. The TIVs 303 are conductive metal structures that extend through the thickness of the medium (e.g., molding compound) 70.

In the illustrated example InFO package 300, the top-side redistribution wiring structure 400 comprises three top-side redistribution line (RDL) layers 410, 420, and 430. In other embodiments, different number of RDL layers can be included. Each RDL layer comprises RDLs and vias which are metal conductor features that provide the electrical interconnections through and within the top-side redistribution wiring structure 400. In some embodiments, the RDL lines and vias comprise copper. In the first top-side RDL layer 410, first level conductors (RDL-1) 412 and first level vias (RDL-1 vias) 415 provide the interconnections. In the first top-side RDL layer 410, a dielectric layer 413 is provided over the RDL-1 412. In the second top-side RDL layer 420, second level conductors (RDL-2) 422 and second level vias (RDL-2 vias) 425 provide the interconnections. In the second top-side RDL layer 420, a dielectric layer 423 is provided over the RDL-2 422. In the third top-side RDL layer 430, which is the last RDL layer, third level conductors (RDL-3) 432 and under ball metal (UBM) pads 435 provide the interconnections. The solder bumps 600 are formed on the UBM pads 435. In the third top-side RDL layer 430, a dielectric layer 433 is provided over the RDL-3 432.

The InFO package 300 comprises one or more integrated patch antenna 427 electrically coupled to the RF IC die 310 by a feed line 428. A patch antenna is a microstrip antenna comprising a flat rectangular sheet or "patch" of metal, mounted over a larger sheet of metal called a ground plane. In some embodiments, the patch antenna is formed in one of the RDL layers. Each integrated patch antenna 427 is provided with an antenna cavity structure 327 underneath the integrated patch antenna 427. The antenna cavity structure 327 is formed by a cavity sidewall 303A that is connected to a ground plane 510 which forms the bottom side of the antenna cavity 327. In some embodiments, the cavity sidewall 303A comprises TIVs. In other embodiments, the cavity sidewall comprises one or more continuous elongated "slot vias".

Generally, a patch antenna includes a radiating patch on one side of a dielectric substrate which has a ground plane on the other side. The integrated patch antenna 427 can be provided in any shape. For example, the shape of the integrated patch antenna 427 can be provided in any shape, e.g. a circle, an ellipse, or any desired polygonal shape such as a triangle, a square, a rectangle, a pentagon, a hexagon, an octagon, etc. However, for a given RF application for the InFO package, a particular shape may be desirable for the integrated patch antenna 427 based on the particular RF signal transmission/reception specifications imposed by that RF application. For example, in some intended applications, a square shaped patch antenna may be advantageous compared to other shapes.

The ground plane 510 is a conductor structure in the back-side redistribution metal layer 500 that is electrically grounded when the InFO package 300 is installed into its intended application environment. For example, in some embodiments, the ground plane 510 is electrically conductively connected to solder bumps 600A by way of the TIV 303 and the corresponding top-side redistribution wiring structures, RDL-1 412, RDL-1 via 415, RDL-2 422, RDL-2 via 425, RDL-3 432, and UBM pad 435. The ground plane 510 can be formed as a solid metal planar structure or any other suitable structure. For example, in some embodiments, the ground plane 510 can be formed as a mesh or a set of electrically conductively connected parallel lines.

The antenna cavity sidewalls 303A are formed from a conductive material. In the example InFO package 300, the cavity sidewalls 303A are formed from the same conductive metal as the TIVs 303. When the InFO package 300 is installed into its intended application environment, the solder bumps 600A are connected to electrical ground and, in turn, the ground plane 510 and the cavity sidewall 303A become grounded.

Figure 32A:
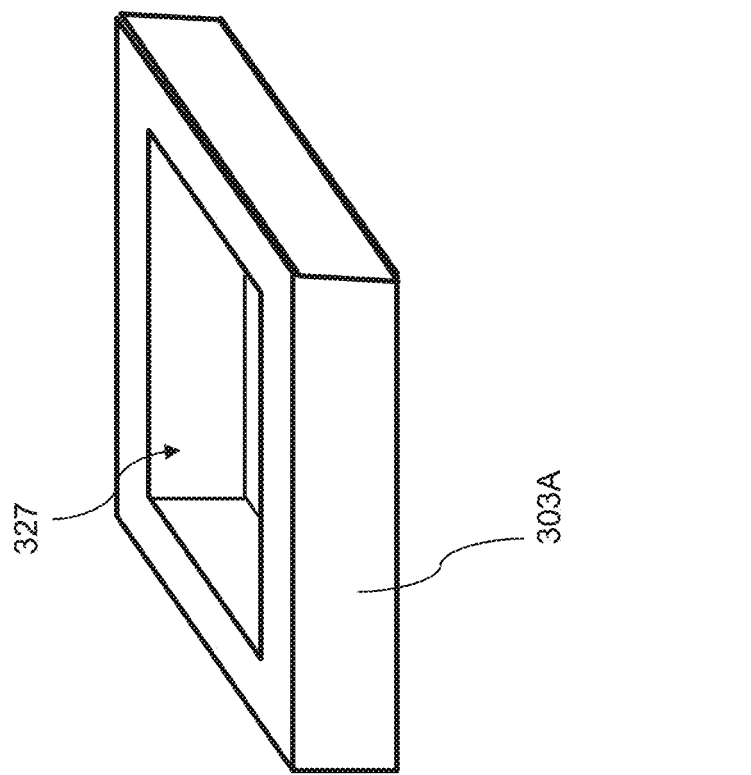
FIG. 32A is an illustration of an antenna cavity formed by a single solid wall structure according to some embodiments.
Figure 32B:
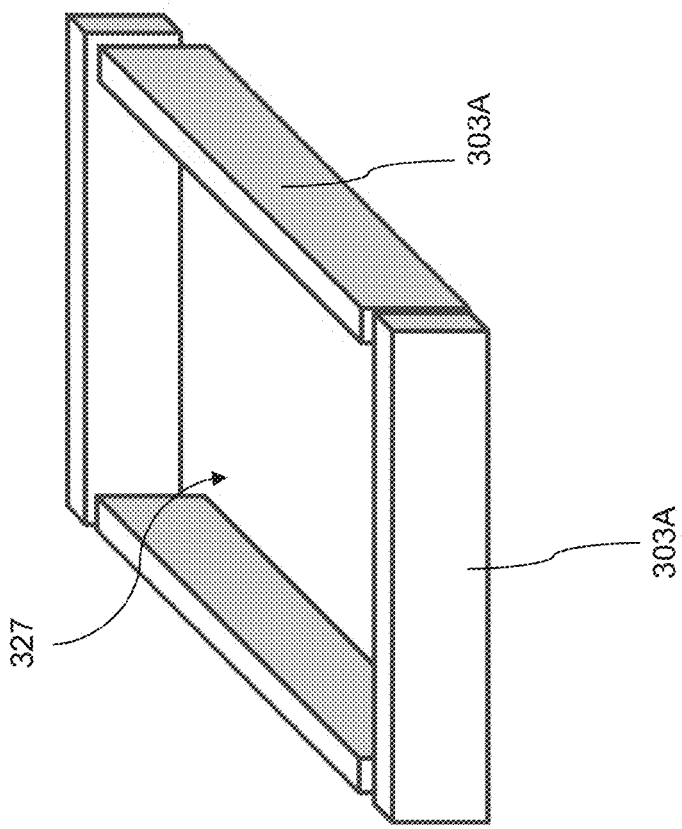
FIG. 32B is an illustration of an antenna cavity formed by two or more continuous solid segments according to some embodiments.
Figure 32C:
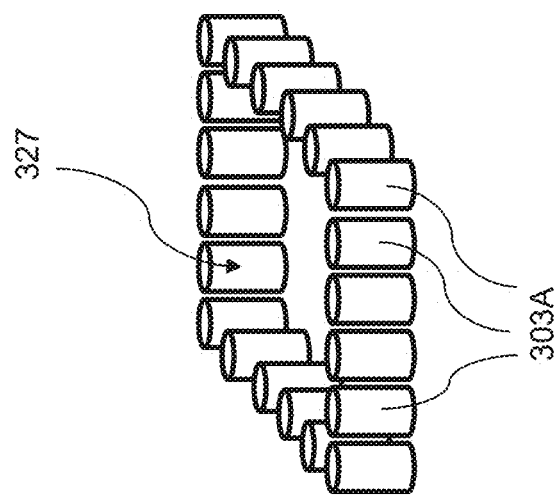
FIG. 32C is an illustration of an antenna cavity formed by a plurality of through-insulator vias (TIVs) according to some embodiments.

In some embodiments, each of the cavity sidewalls 303A can be formed as a single continuous solid wall structure connected on the bottom side by the ground plane 510 enclosing an area underneath the integrated patch antenna 427. FIG. 32A provides a schematic illustration of this example. In other embodiments, each of the cavity sidewalls 303A can be formed of two or more continuous solid segments that together enclose an area underneath the integrated patch antenna 427. FIG. 32B provides a schematic illustration of this example. On each side of the cavity sidewall structure, a continuous solid segment extends an entire distance from one corner of the cavity sidewall structure to an adjacent corner of the cavity sidewall structure. The two or more solid segments can be separated by a spacing from about 10 µm. In other embodiments, the cavity sidewalls 303A can be formed from a plurality of TIVs that together define the perimeter of the antenna cavity 327. The spacing between adjacent TIVs forming the cavity sidewalls is selected based on the wavelengths of the signals the antenna is intended to transmit during operation. FIG. 32C provides a schematic illustration of this example. In some embodiments, the spacing between the TIVs are in a range from about 10 µm wide.

The cavity sidewalls 303A and the ground plane 510 can be formed to have any shape for its perimeter outline. In some embodiments, the cavity sidewalls 303A and the ground plane 510 are configured to have perimeter outline shapes that match the perimeter outline of the integrated patch antenna 427. Thus, if the integrated patch antenna 427 is square shaped, the cavity sidewalls 303A and the ground plane 510 will also be provided to have a square shaped outline that is of the appropriate size to match the size of the integrated patch antenna 427.

Figure 14:
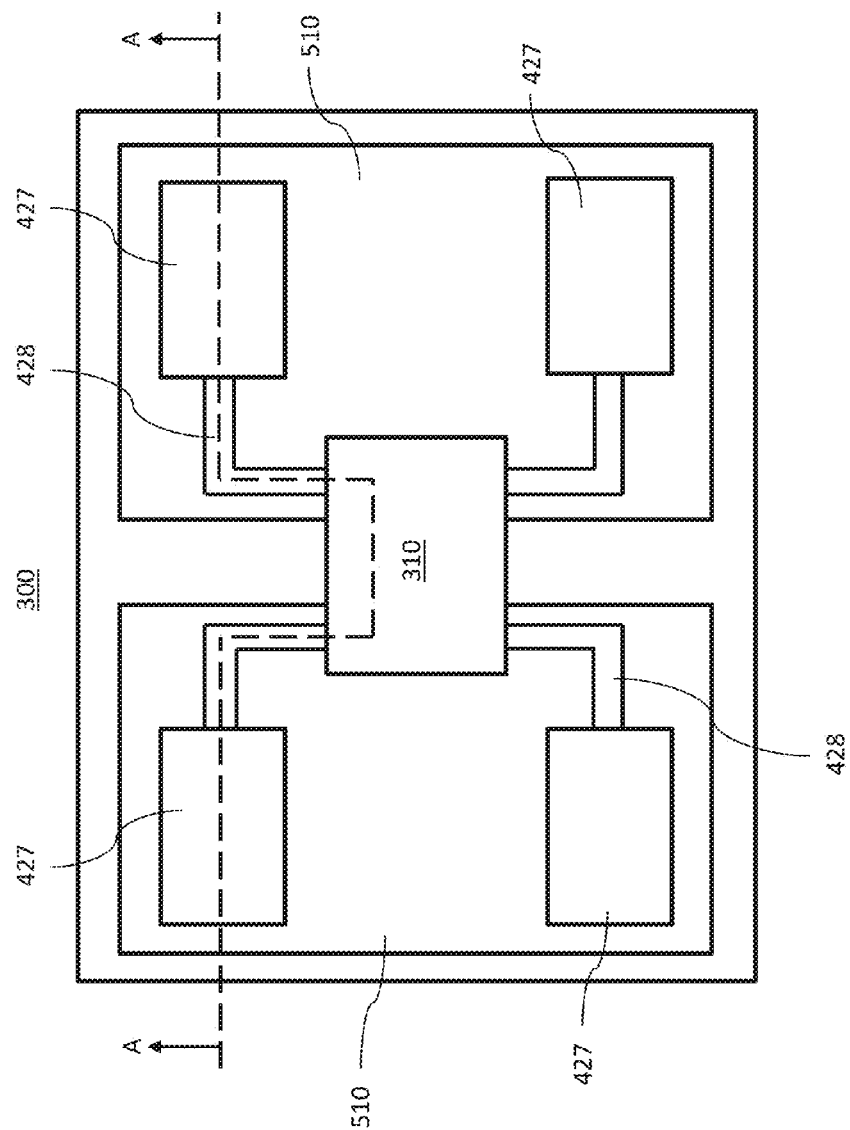
FIG. 14 is an illustration of a top-down view of the InFO package showing an arrangement of patch antennas according to some embodiments of the present disclosure.

FIG. 14 a schematic illustration of a top-down view of the InFO package 300. The RF IC die 310 is shown in the center that is connected to four patch antennas 427. Antenna feed lines 428 connect the patch antennas 427 to the RF IC die 310. The ground plane 510 positioned below the patch antennas 427 can be seen. The antenna cavities 327 and the cavity sidewalls 303A are underneath the patch antennas 427 between the patch antennas 427 and the ground plane 510 and thus are not visible in this top-down view.

Figure 15:
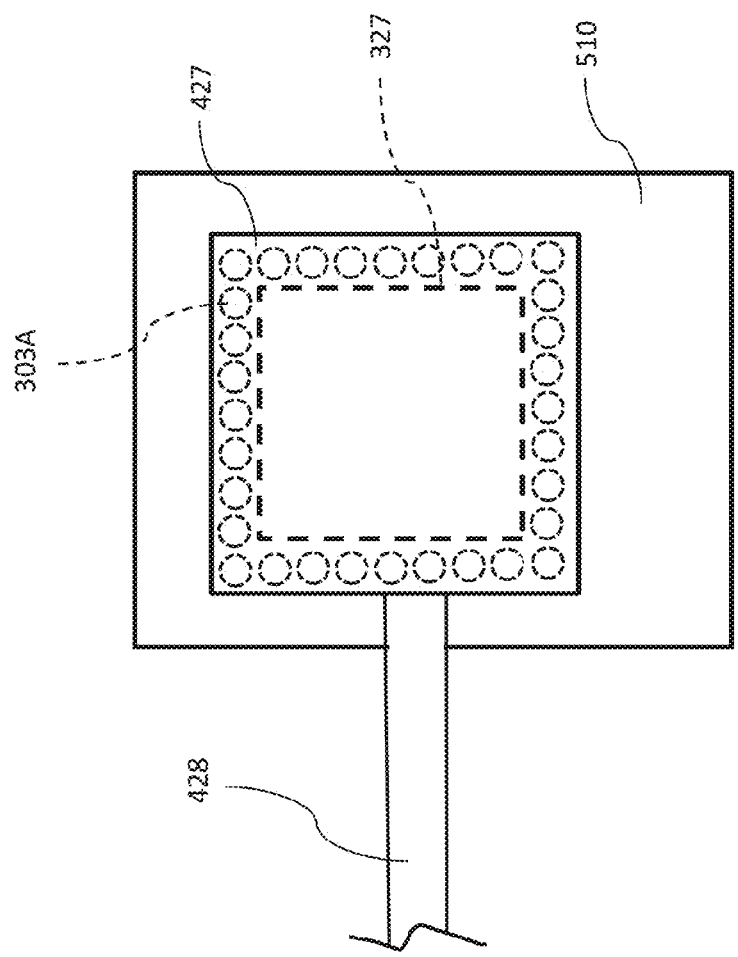
FIG. 15 is an illustration of a top-down view of one of the patch antenna from FIG. 14 according to some embodiments.

FIG. 15 is a schematic illustration of a top-down view of one of the patch antennas from FIG. 14. The insulator filled antenna cavity 327 defined by the cavity sidewall structures 303A and the ground plane 510 is shown. In this example, a plurality of TIV structures form the cavity sidewall structure 303A. In some embodiments, sidewall structures comprising TIV's are conductively connected to the ground plane 510, but the top ends of the TIV structures do not contact the patch antennal 427.

Figure 16:
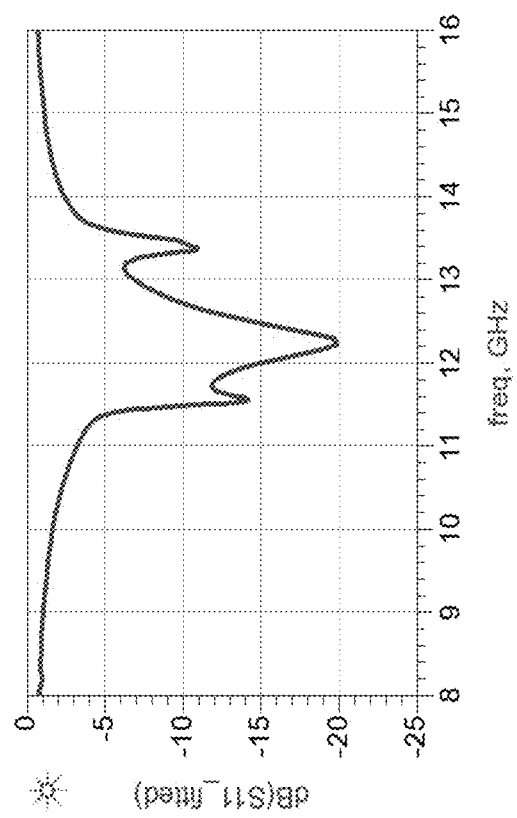
FIG. 16 is a plot of the S11 parameter, the reflection coefficient, of the patch antenna structure of FIG. 15 according to some embodiments.

FIG. 16 is a plot of the S11 parameter, the reflection coefficient, of the patch antenna 427 structure having the insulator filled antenna cavity 327 shown in FIG. 15. The 511 values were generated from a simulation of the patch antenna 427 structure shown in FIG. 15. The plot shows that the antenna efficiently radiates between about 11.5 GHz and 12.8 GHz. Therefore such antenna would be suitable for meeting the specifications of the future $4^{th}$ generation (5.8 GHz) and $5^{th}$ generation (38 GHz) high frequency RF transceivers in mobile communication applications.

The antenna cavity 327 can be filled with any one of a number of insulator materials compatible with InFO package processing and not limited by the insulator's dielectric constant. Thus, the patch antenna structure of the present disclosure can be robustly implemented in a InFO package process using high-k or low-k materials.

As described below, one of the benefits of the integrated patch antenna 427 having the associated antenna insulator cavity 327 according to this disclosure is that these structures can be formed using the existing InFO package manufacturing process flow without interrupting the process flow or requiring retooling of the process equipment. The InFo package manufacturing process can utilize 12 inch wafer fabrication processing tools, for example. Therefore, the InFO package having the integrated patch antenna 427 and the associated antenna insulator cavity 327 provides a low-cost solution for meeting more demanding antenna efficiency specifications of the future (e.g., 4$^{th}$ and 5$^{th}$) generation high frequency RF transceiver applications.

Figure 17:
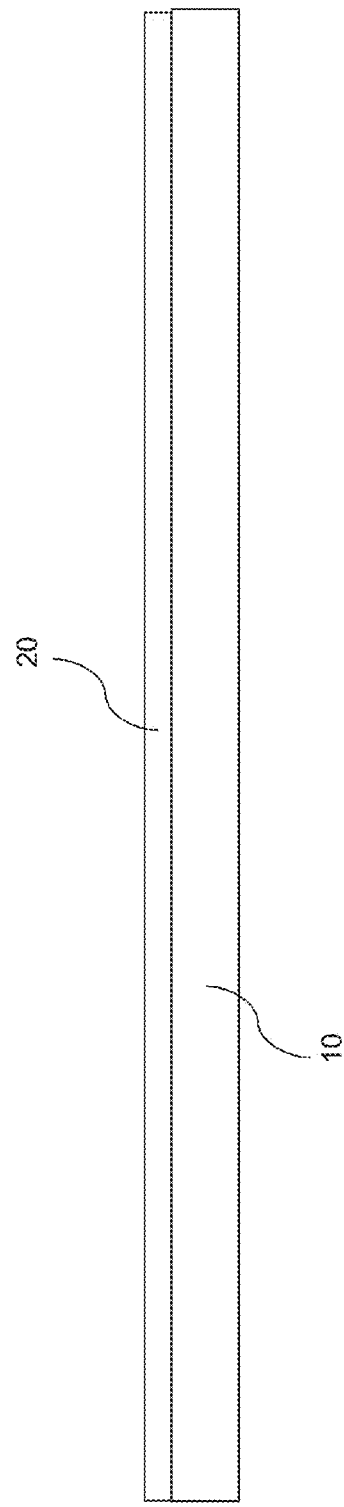
FIGS. 17 through 31 show cross-sectional views of intermediate stages in the manufacturing of an InFO package in accordance with some exemplary embodiments.

Referring to FIGS. 17 through 31, an example of a process of forming the InFO package 300 is described. FIGS. 17 through 31 show cross-sectional views of intermediate stages in the manufacturing of an InFO package 300 structure in accordance with some exemplary embodiments. Referring to FIG. 17, a carrier 10 is provided, and an adhesive layer 20 is deposited on the carrier 10. The carrier 10 can be a blank glass carrier, a blank ceramic carrier, or the like. The adhesive layer 20 can be formed of an adhesive such as a ultra-violet (UV) glue, Light-to-Heat Conversion (LTHC) glue, or the like, although other types of adhesive may be used.

Figure 18:
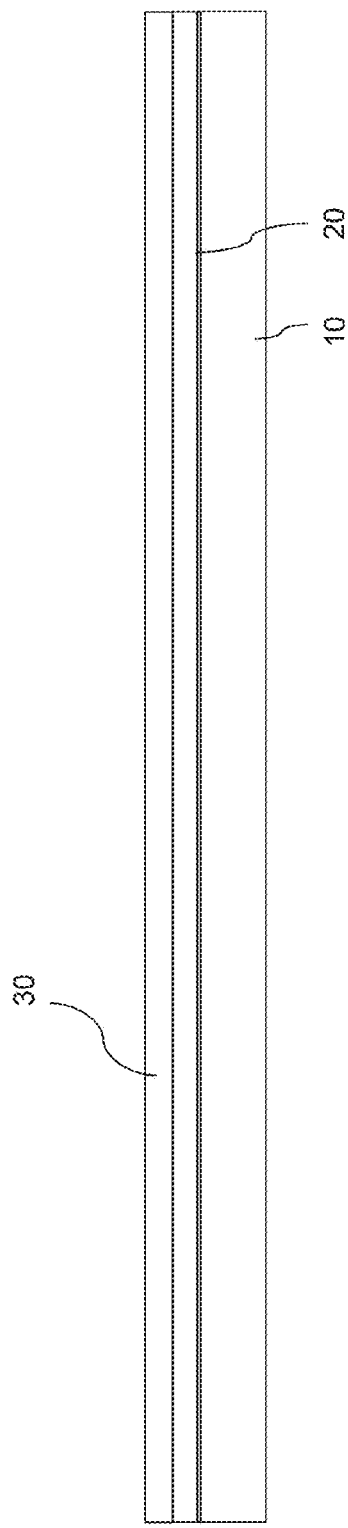

Referring to FIG. 18, a back-side buffer layer 30 is formed over the adhesive layer 20. The back-side buffer layer 30 is a dielectric layer, which can comprise a polymer. The polymer can be, for example, polyimide, PolyBenzOxazole (PBO), BenzoCycloButene (BCB), Ajinomoto Buildup Film (ABF), Solder Resist film (SR), or the like. The back-side buffer layer 30 is a planar layer having a uniform thickness, wherein the thickness may be greater than about 2 μm, and may be from about 2 μm to about 40 μm. The top and the bottom surfaces of the back-side buffer layer 30 are also planar. The back-side buffer layer 30 will act as the final protective insulator for the finished InFO package 300.

Next, one or more of the ground plane structures 510 are formed in the back-side redistribution metal layer 500. The back-side redistribution metal layer 500 is formed of conductor metal such as Cu or Cu-based alloy and the ground plane structures 510 can be selectively deposited on the back-side buffer layer 30 by electroplating through a photoresist mask layer which is then removed. The intermediate photoresist mask formation and removal are not illustrated. In this example, the ground plane structures 510 are formed by electroplated Cu that are about 7 μm thick. The Cu was plated over a Ti/Cu (1000/5000 Å thick) seed layer.

Figure 20:
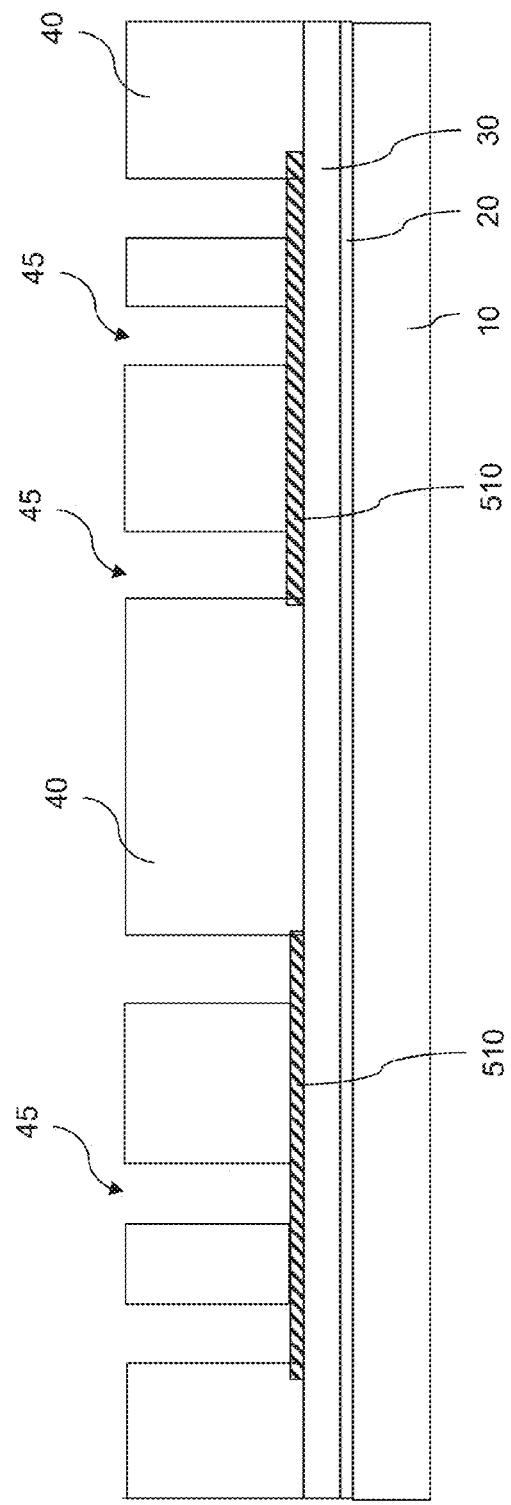

Referring to FIG. 20, a coating of photoresist 40 is applied over the ground plane structure 510 and the exposed portions of the back-side buffer layer 30. Then, the photoresist 40 is patterned to form openings or recesses 45 in the photoresist 40. Such patterning is done by a photolithography process. The recesses 45 expose some portions of the back-side redistribution metal layer 500. The recesses 45 will be subsequently filled with conductive metal to make the TIVs 303 and cavity sidewalls 303A. Thus, the shape of the recesses 45 will depend on whether recesses are for the TIVs 303 or the cavity sidewalls 303A. For example, if a particular recess is intended for forming a TIV 303, that recess 45 will be a hole appropriately shaped to form the TIV 303. TIVs can be cylindrical in form or pillars having different polygonal cross-sectional shape. If a particular recess is intended for forming a cavity sidewall 303A, that recess 45 can be a hole or a trench depending on whether the cavity sidewall 303A is formed from a plurality of TIVs, two or more solid segments, or a single solid wall-like structure. The recesses 45 will have a depth that can form the TIVs and the cavity sidewalls 303A with a desired height. In typical InFO packages, the recesses 45 will be sufficiently deep to form TIVs 303 having a height of about 120-250 μm. The height of the TIVs 303 is determined by the thickness of the subsequently placed IC dies, such as the RF IC die 310 in the example InFO package 300.

Figure 21:
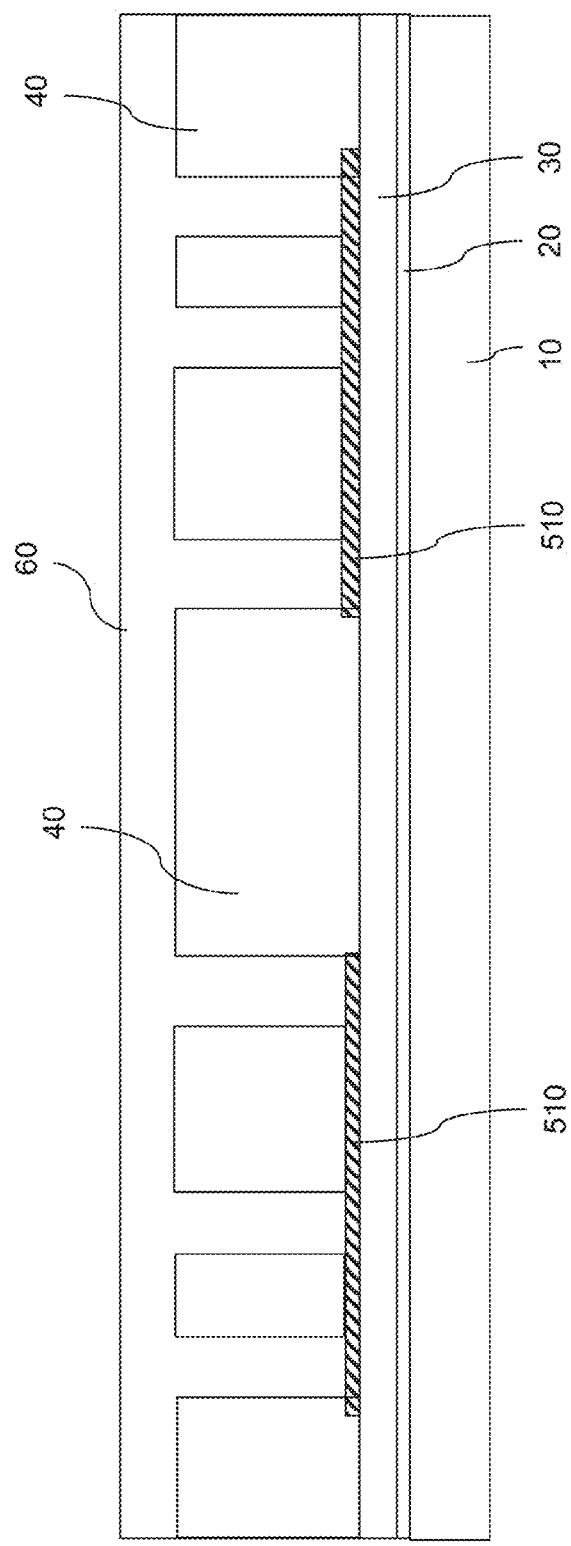

Referring to FIG. 21, a thin seed layer of Ti/Cu (1000/5000 Å thick) (not shown) is formed on the structure of FIG. 20 in preparation for electroplating deposition of the TIVs 303 and the cavity sidewalls 303A so that the seed layer is covering the surfaces of the photoresist 40 and the exposed back-side redistribution metal layer 500, such as the ground plane structure 510 at the bottom of the recesses 45. Next, the metal features such as the TIVs 303 and the cavity sidewalls 303A are formed by filling the recesses 45 in the photoresist 40 with conductive metal 60 by plating, which may be electro plating or electro-less plating, on the seed layer 50. The conductive metal 60 may comprise such conductive metals as copper, aluminum, tungsten, nickel, or alloys thereof.

Figure 22:
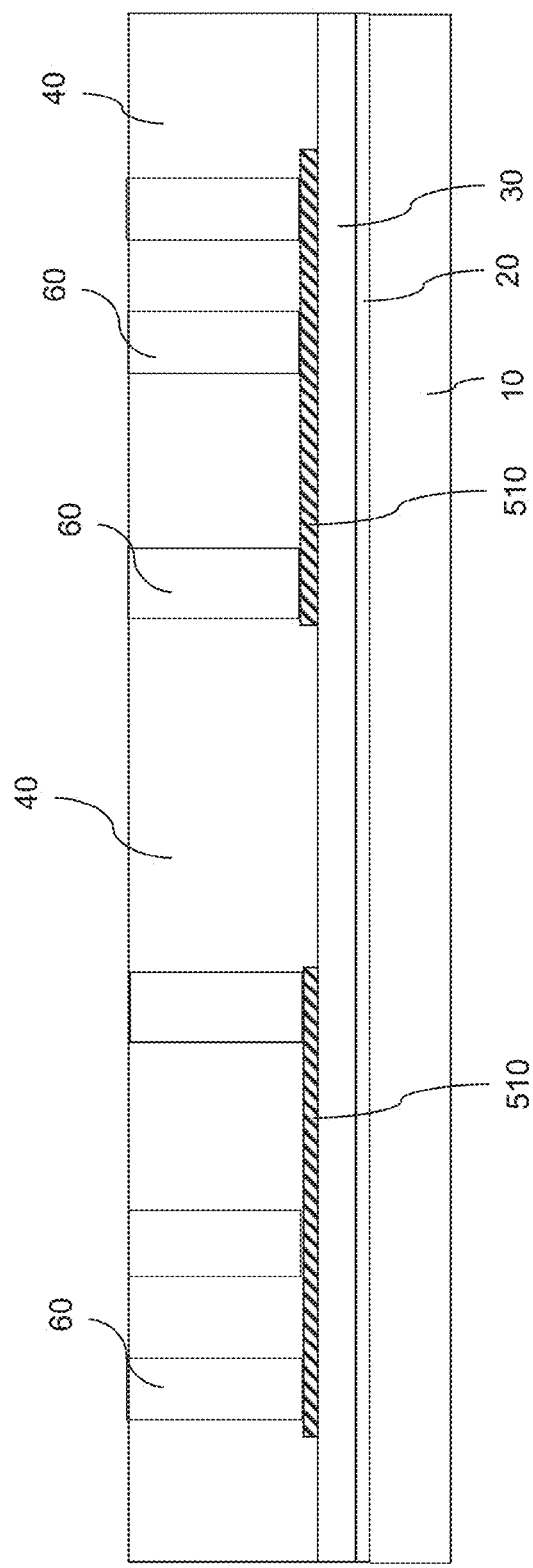

Next, referring to FIG. 22, any excess portion of the conductive metal 60 is removed by a process such as chemical mechanical polishing (CMP), exposing the tops of the recesses 45 and the photoresist layer 40. The recesses are now filled with the conductive metal 60.

Figure 23:
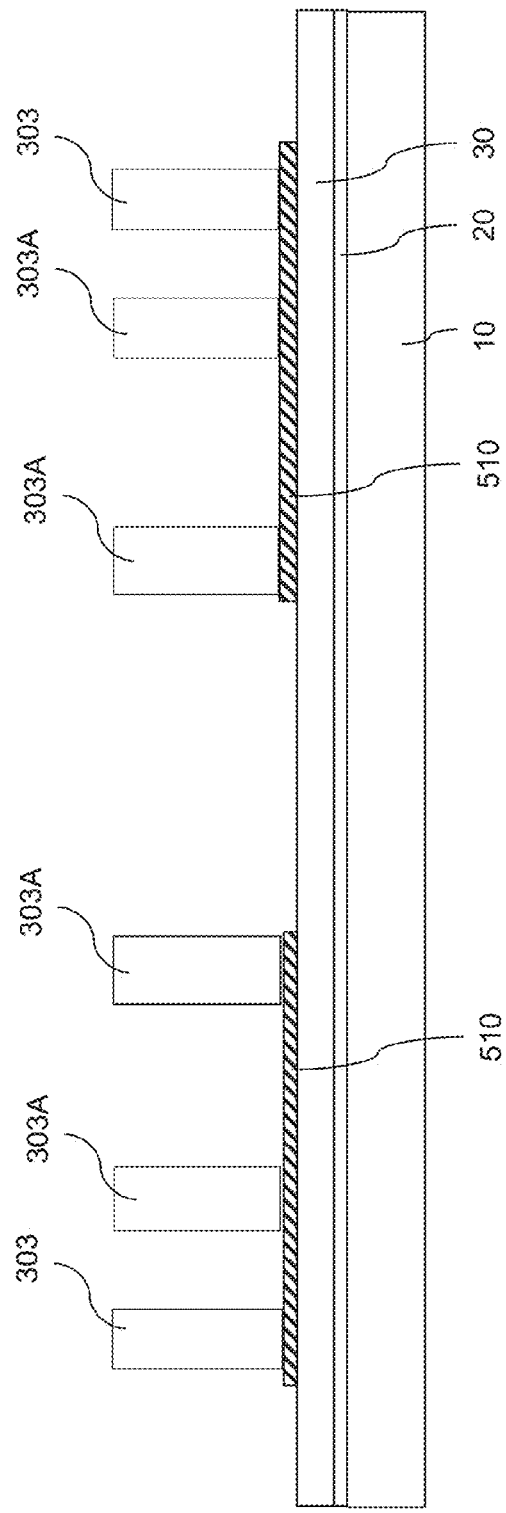

Next, the photoresist 40 is removed and the resulting structure is shown in FIG. 23. The recesses 45 in the photoresist 40 now form the TIVs 303 and the cavity sidewalls 303A structures.

Figure 24:
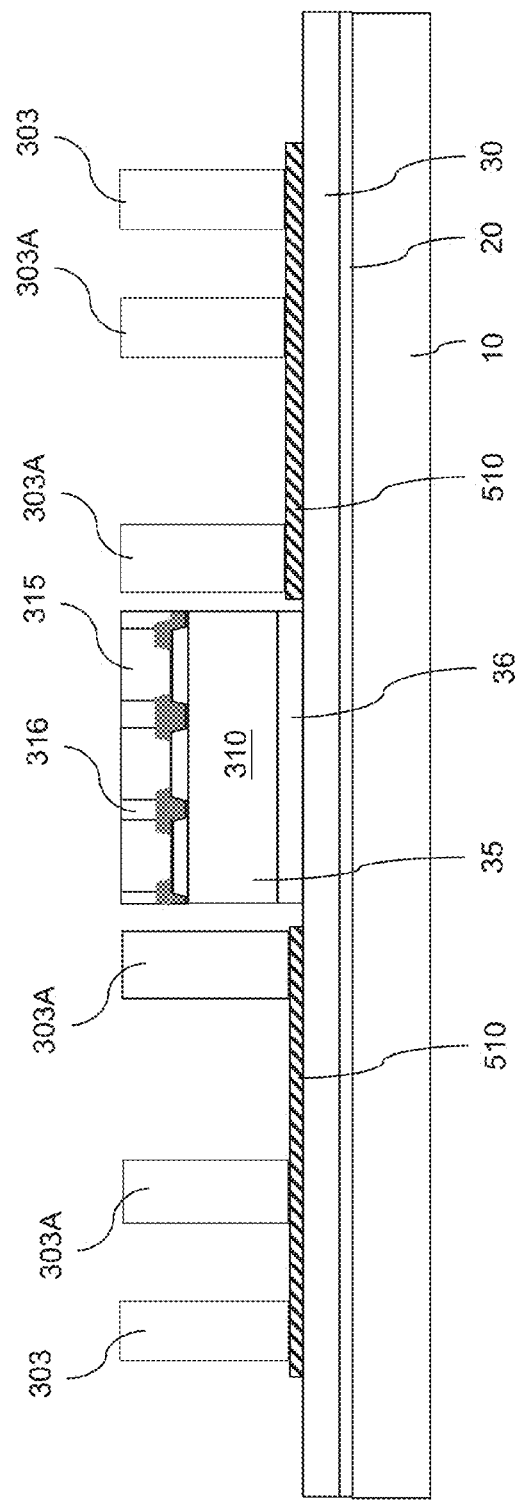

FIG. 24 illustrates the placement of the RF IC die 310 on the back-side buffer layer 30. IC dies such as the RF IC die 30 can be adhered to the back-side buffer layer 30 using a die-attach-film (DAF) 36. The RF IC die 310 includes semiconductor substrate 35 (a silicon substrate, for example) whose back surface is in contact with the DAF 36. The RF IC die 310 includes metal pillars 315 (such as copper posts) that are formed as the top portions of the RF IC die 310 that electrically connects the RF IC die 310 to other conductive devices and interconnect structures in the InFO package 300. A dielectric layer 316 is formed at the top surface of the RF IC die 310 filling the spaces between the metal pillars 315, with the metal pillars 315 having at least their lower portions in the dielectric layer 316. In some embodiments, the top surface of the dielectric layer 316 can be level with the top surfaces of the metal pillars 315, as shown in the RF IC die 310.

Figure 25:
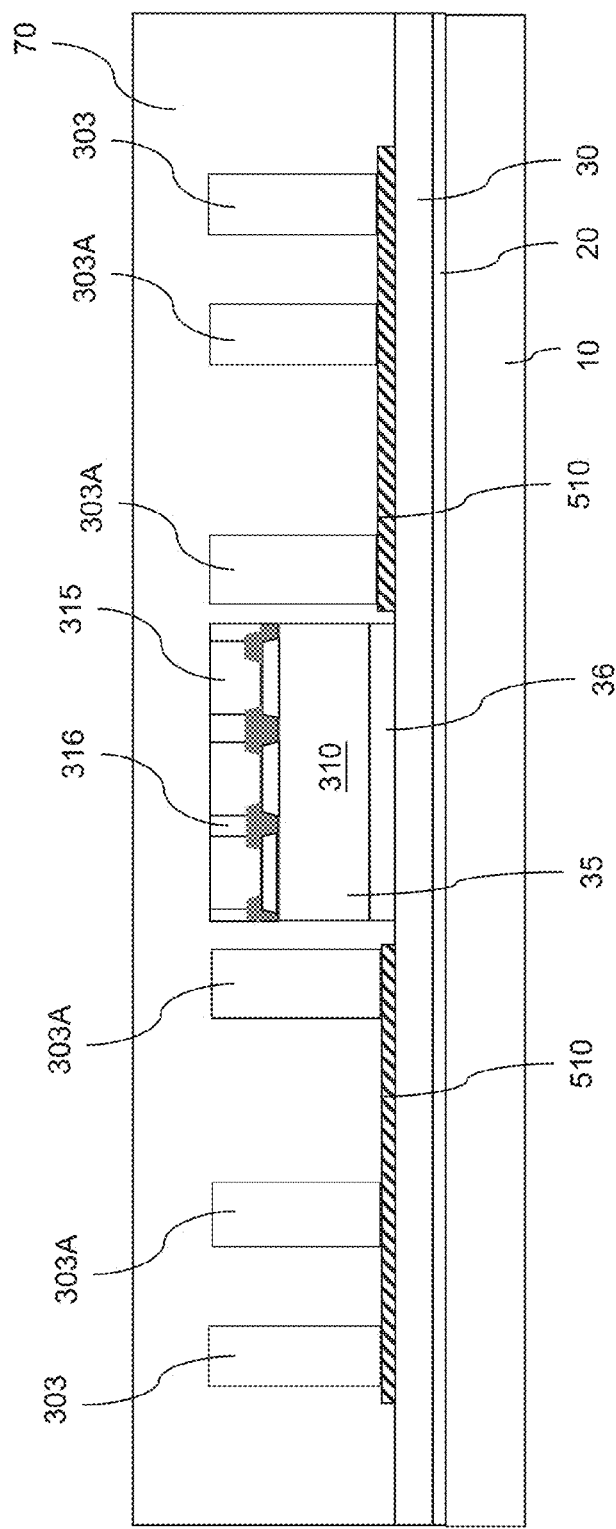

Referring to FIG. 25, a molding compound 70 is applied over the RF IC die 310, the TIVs 303, and the cavity sidewalls 303A and cured. The molding compound 70 fills the gaps between the RF IC die 310, the TIVs 303, and the cavity sidewalls 303A, and may be in contact with any exposed portions of the back-side buffer layer 30 and the ground plane structure 510. The molding compound 70 may include a molding underfill, an epoxy, or a resin. Some suitable molding compounds can be liquid epoxys, such as liquid epoxy containing fine granular silica, liquid glass (SiO$_2$) (spin on glass) or ceramics. Molding compounds such as the liquid epoxy can be applied as a coating, similar to photoresists, then low temperature (about 180° C.) cured and hardened. In some embodiments, the molding compound has a dielectric constant k of 2.8-3.0. Other embodiments include high-k or low-k molding materials. The molding compound 70 provided in sufficient amount to embed the RF IC die 310, the TIVs 303, and the cavity sidewalls 303A. At this stage, the top surface of the molding compound 70 is higher than the top ends of the metal pillars 315 on the RF IC die 310, the TIVs 303, and the cavity sidewalls 303A.

Figure 26:
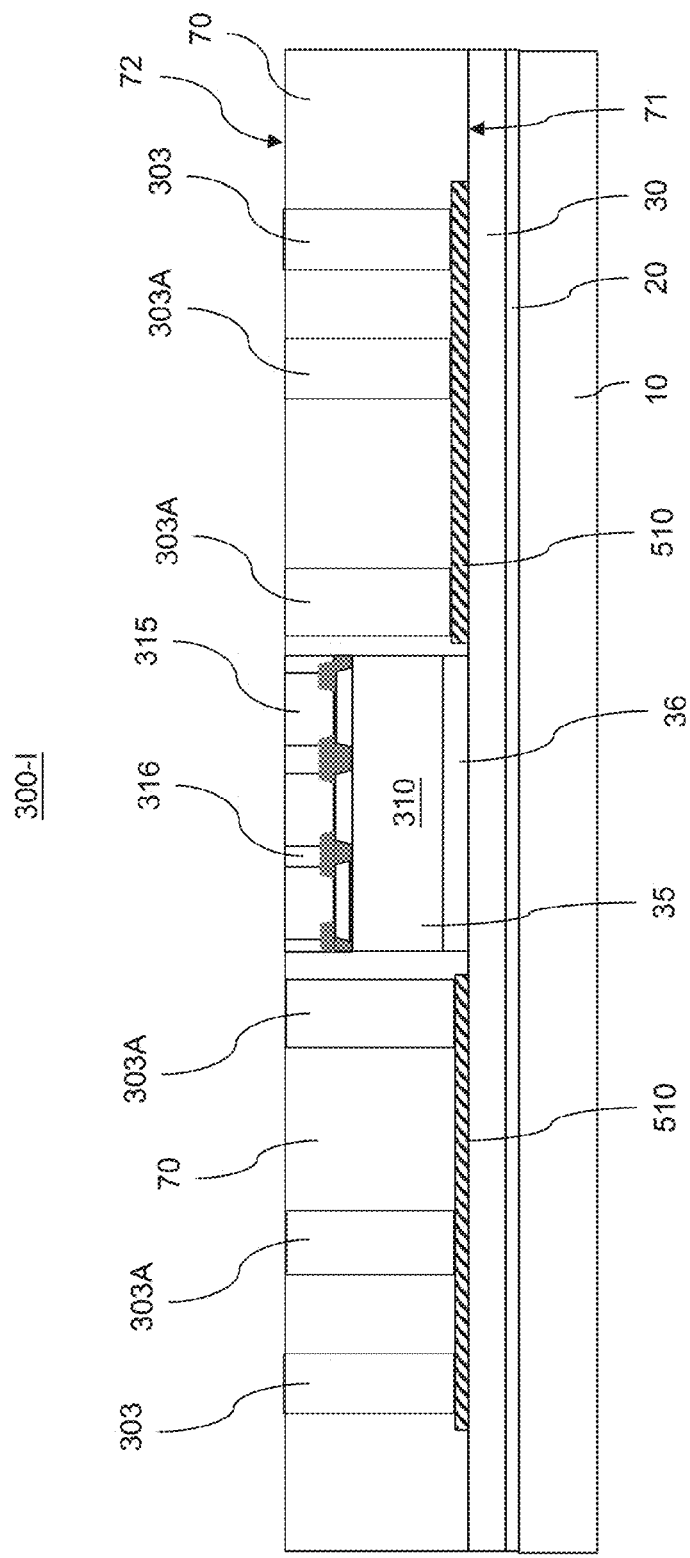

Next, a grinding step is performed to thin the molding compound 70 until the tops of the metal pillars 315, the TIVs 303, and the cavity sidewalls 303A are exposed. The grinding can be accomplished by CMP. The resulting interim substrate structure 300-I is shown in FIG. 26. The grinding leaves the top ends of the metal features, the metal pillars 315, the TIVs 303, and the cavity sidewalls 303A, to be substantially level (coplanar) along the top surface 72. The grinding step can leave behind some metal residue such as metal particles on the top surface 72. Accordingly, after the grinding step, a cleaning may be performed, for example, through a wet etching, to remove the metal residue. The cavity sidewalls 303A and their associated ground plane 510 define the antenna cavity 327. In the interim substrate structure 300-I, the molding compound at least laterally encapsulates the RF IC die 310 between a first surface 71 of the molding compound and a second surface 72 of the molding compound. The one or more TIVs 303 and the one or more cavity sidewalls 303A are in the molding compound and extend from the ground plane structure 510 to the second surface 72 of the molding compound, wherein the cavity sidewalls and their associated ground plane structure 510 define one or more antenna cavities 327.

Figure 27:
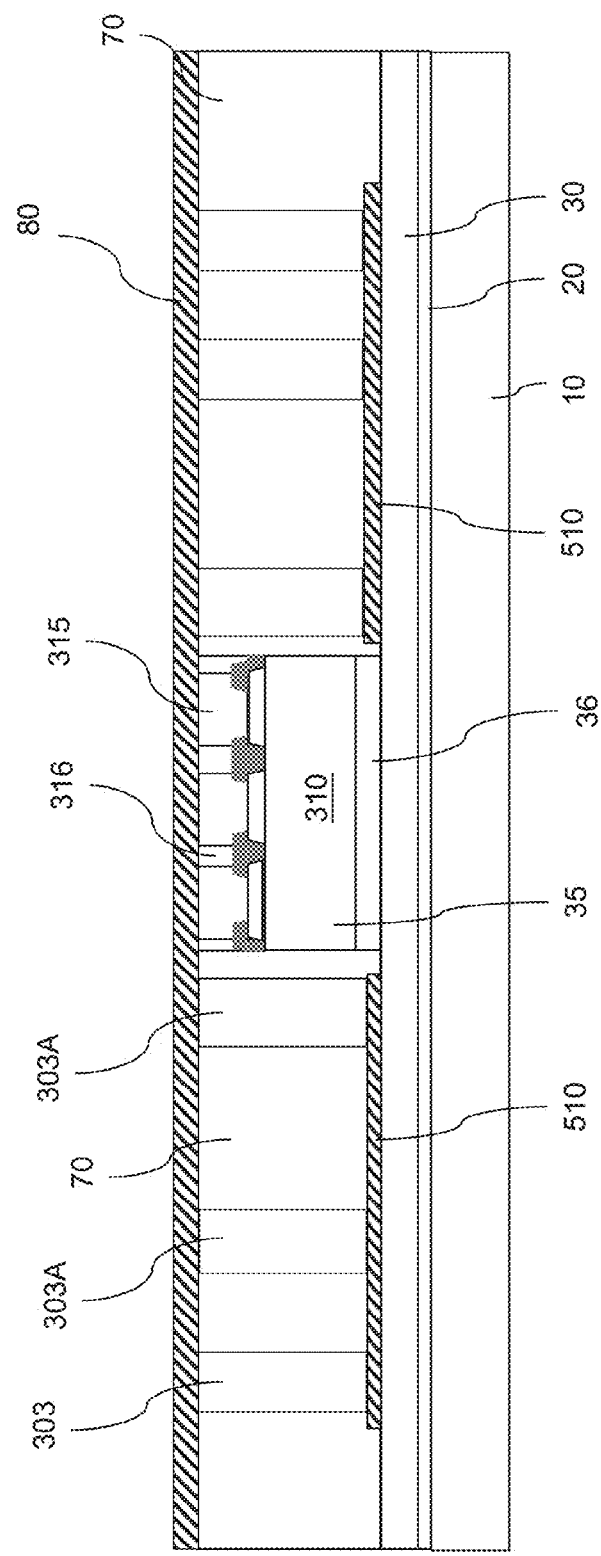
Figure 28:
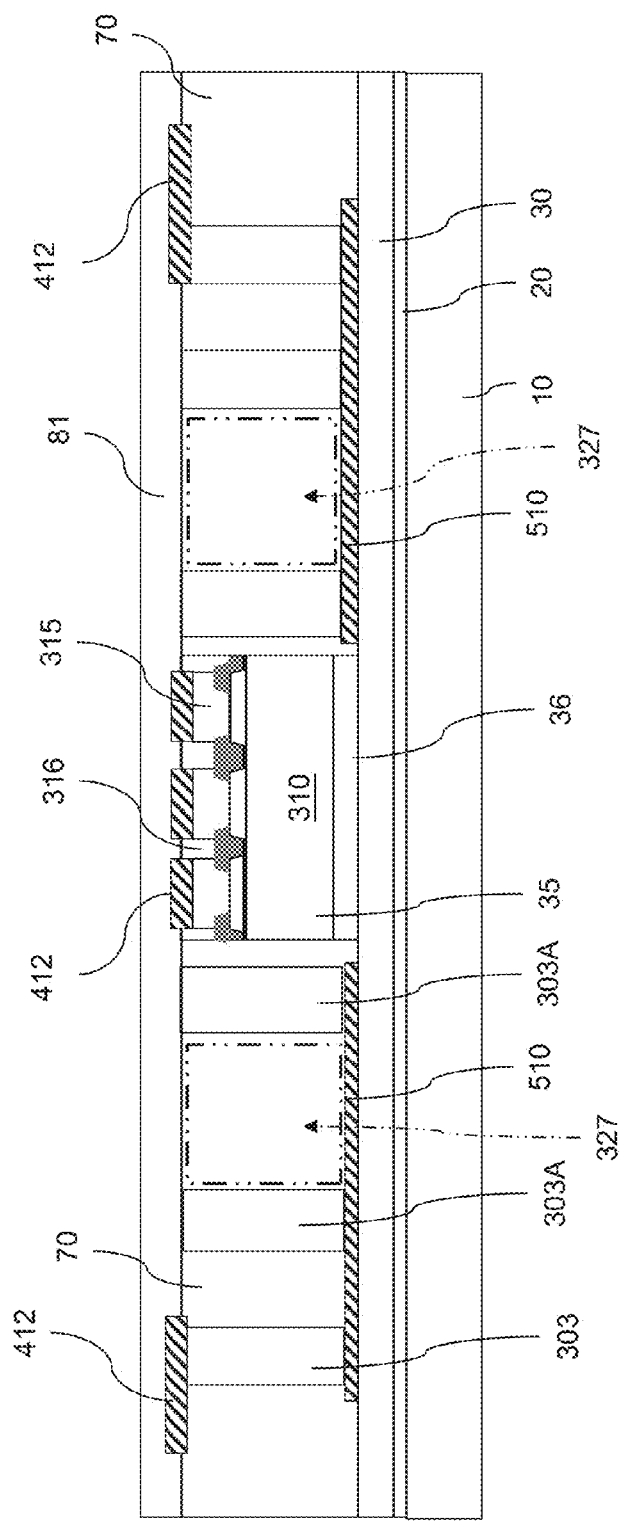

Next, referring to FIG. 27, the first level conductor RDL-1 412 is formed by first forming a first top-side RDL layer 410. Forming the first top-side RDL layer 410 comprises depositing a layer of conductor metal (e.g. copper) 80 over the top surface 70A by plating, which may be electro plating or electro-less plating. In order to enable the electro plating, a very thin seed layer of Ti/Cu (1000/5000 Å thick) (not shown) is first deposited on the top surface 70A. Next, the layer of conductor metal 80 is patterned and etched, leaving behind the first level conductor RDL-1 412 structures over the TIVs 303 and the metal pillars 315 of the RF IC die 310. Then, a dielectric insulation layer (e.g. PBO) 81 is applied over the resulting structure. The dielectric insulation layer 81 is about 4.5 μm thick. This structure is shown in FIG. 28.

Figure 30:
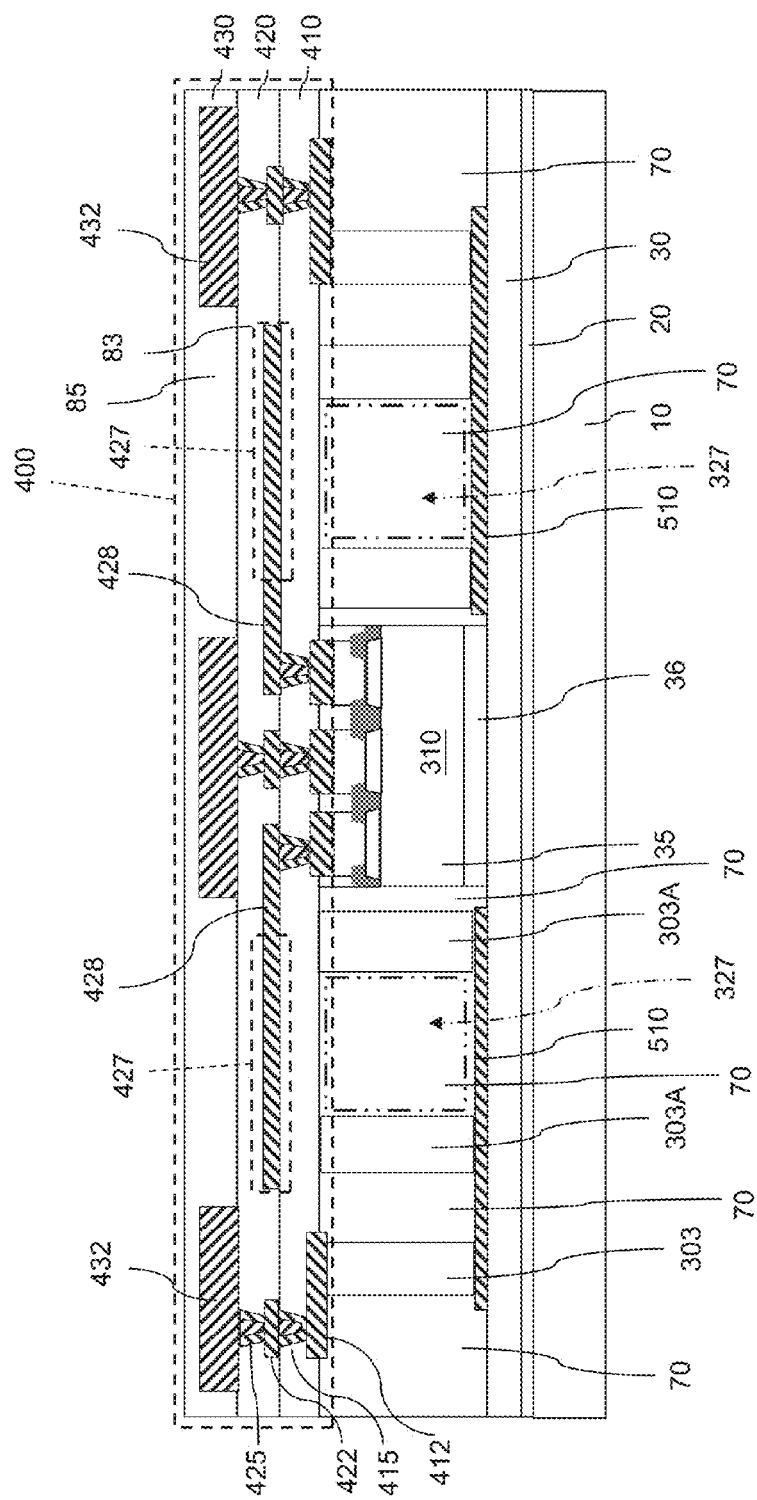

Forming the top-side redistribution wiring structure 400 is continued by patterning the dielectric insulation layer 81 and forming openings for vias which are then filled with conductor metal (e.g. copper) to form the RDL-1 vias 415 and completing the first top-side RDL layer 410. The top surface of the first top-side RDL layer 410 is ground and polished. Then the second top-side RDL layer 420 is formed on the first top-side RDL layer 410. In order to form the second top-side RDL layer 420, a layer of conductor metal (e.g. copper) is deposited over the first top-side RDL layer 410 then patterned and etched, leaving behind the second level conductor RDL-2 422 structures over the first top-side RDL layer 410. A dielectric insulation layer (e.g. PBO) 83 is then applied over the resulting structure. This structure is shown in FIG. 30.

Figure 29:
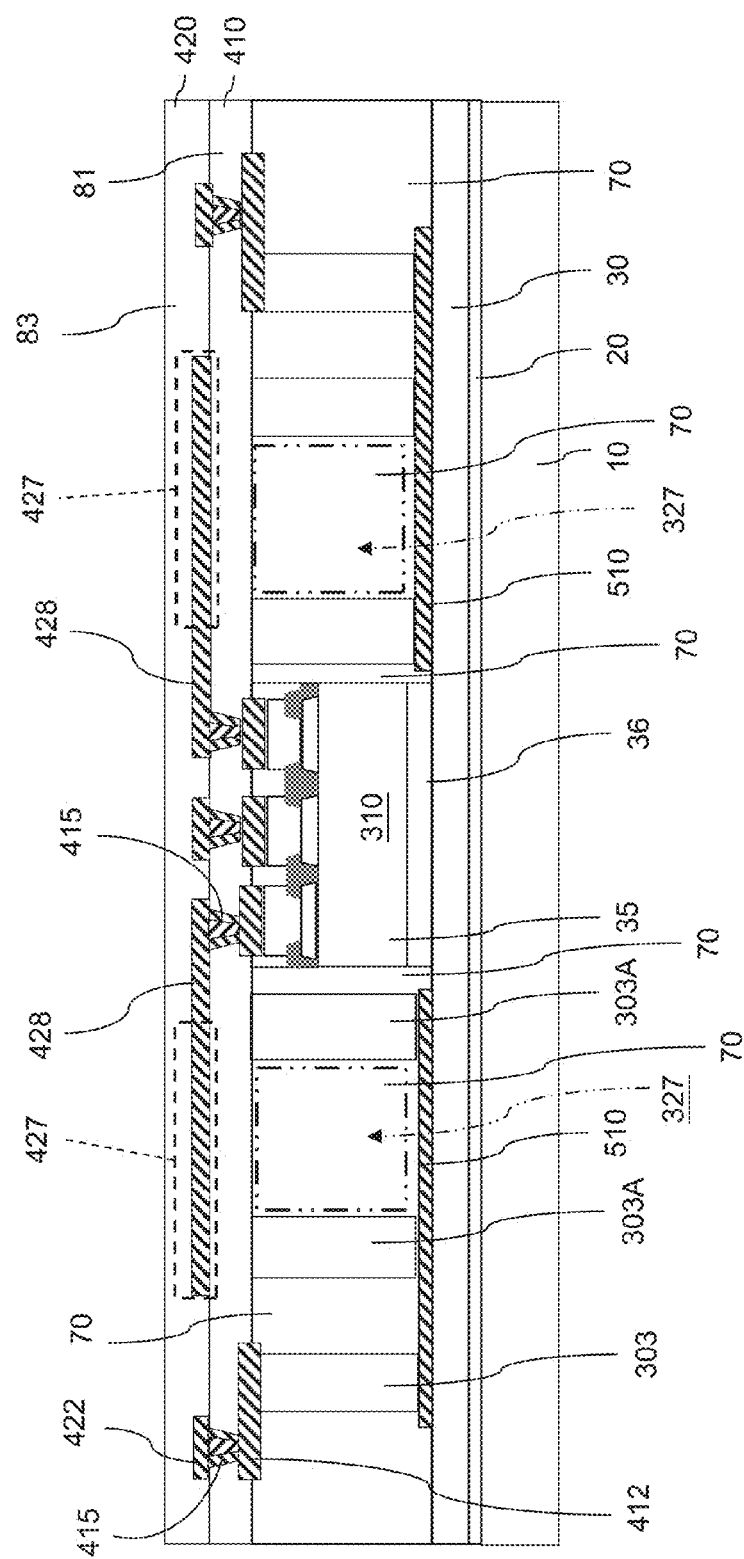

As shown in FIG. 29 and as mentioned above, some of the second level conductor RDL-2 422 structures include the one or more patch antenna structures 427 according to the present disclosure. The patch antenna structures 427 are formed to be positioned over the antenna cavity 327 defined by the cavity sidewalls 303A and the ground plane 510.

Forming the top-side redistribution wiring structure 400 is continued by patterning the dielectric insulation layer 83 and forming openings for vias which are then filled with conductor metal (e.g. copper) to form the RDL-2 vias 425 and completing the second top-side RDL layer 420. The top surface of the second top-side RDL layer 420 is ground and polished. Then the third top-side RDL layer 430 is formed on the second top-side RDL layer 420. In order to form the third top-side RDL layer 430, a layer of conductor metal (e.g. copper) is deposited over the second top-side RDL layer 420 then patterned and etched, leaving behind the third level conductor RDL-3 432 structures over the second top-side RDL layer 420. A dielectric insulation layer (e.g. PBO) 85 is then applied over the resulting structure. This structure is shown in FIG. 30.

Forming the top-side redistribution wiring structure 400 is continued by patterning the dielectric insulation layer 85 and forming openings for under ball metal (UBM) pads 435 which are then filled with conductor metal (e.g. copper) to form the UBM pads 435 and completing the third top-side RDL layer 430. This structure is shown in FIG. 31.

Figure 31:
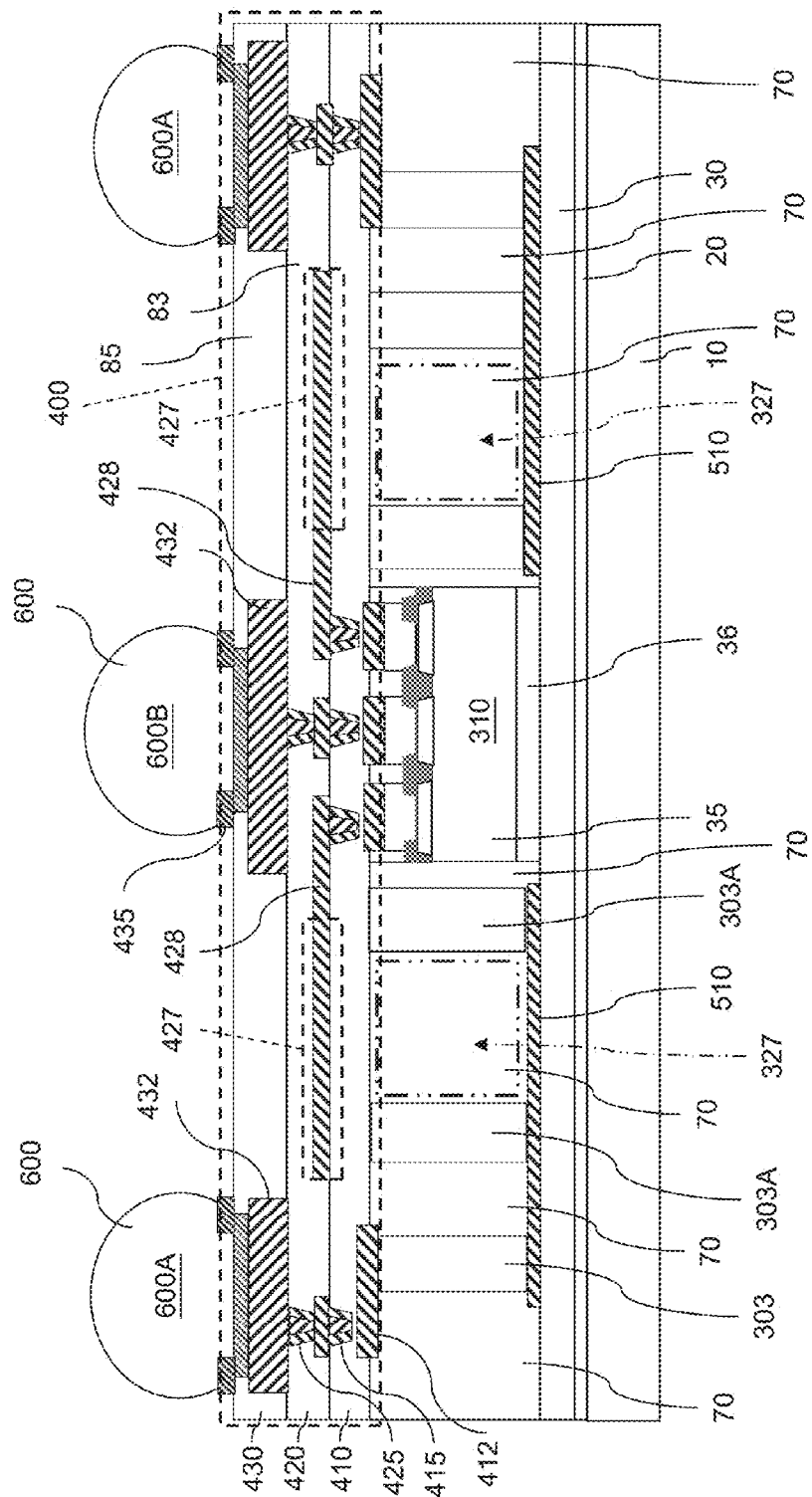

FIG. 31 further shows the formation of the next level electrical interconnection structures 600 in accordance with some embodiments. In this embodiment, the electrical interconnection structures 600 are solder bumps attached to the exposed portions of the UBM pads 435. The solder bumps 600 can be formed by placing solder balls on the UBM pads 435 and then reflowing the solder balls. In alternative embodiments, the formation of the solder bumps 600 includes performing a plating step to form solder regions over the UBM pads 435, and then reflowing the solder regions. In other embodiments the electrical interconnection structures 600 can be metal pillars, or metal pillars and solder caps, which may also be formed through plating.

The RDL-1 412, RDL-1 vias 415, RDL-2 422, RDL-2 vias 425, RDL-3 432, and UBM pads 435 can comprise a metal or a metal alloy including aluminum, copper, tungsten, and/or alloys thereof.

In some embodiments, the dielectric insulation layers 81, 83, and 85 may comprise a polymer such as polyimide, benzocyclobutene (BCB), polybenzoxazole (PBO), or the like. Alternatively, the dielectric layers 81, 83, and 85 may include non-organic dielectric materials such as silicon oxide, silicon nitride, silicon carbide, silicon oxynitride, or the like.

Next, the InFO package 300 is debonded from the carrier 10. The adhesive layer 20 is also cleaned from the InFO package 300. The resulting final InFO package 300 is shown in FIG. 13.

Figure 33A:
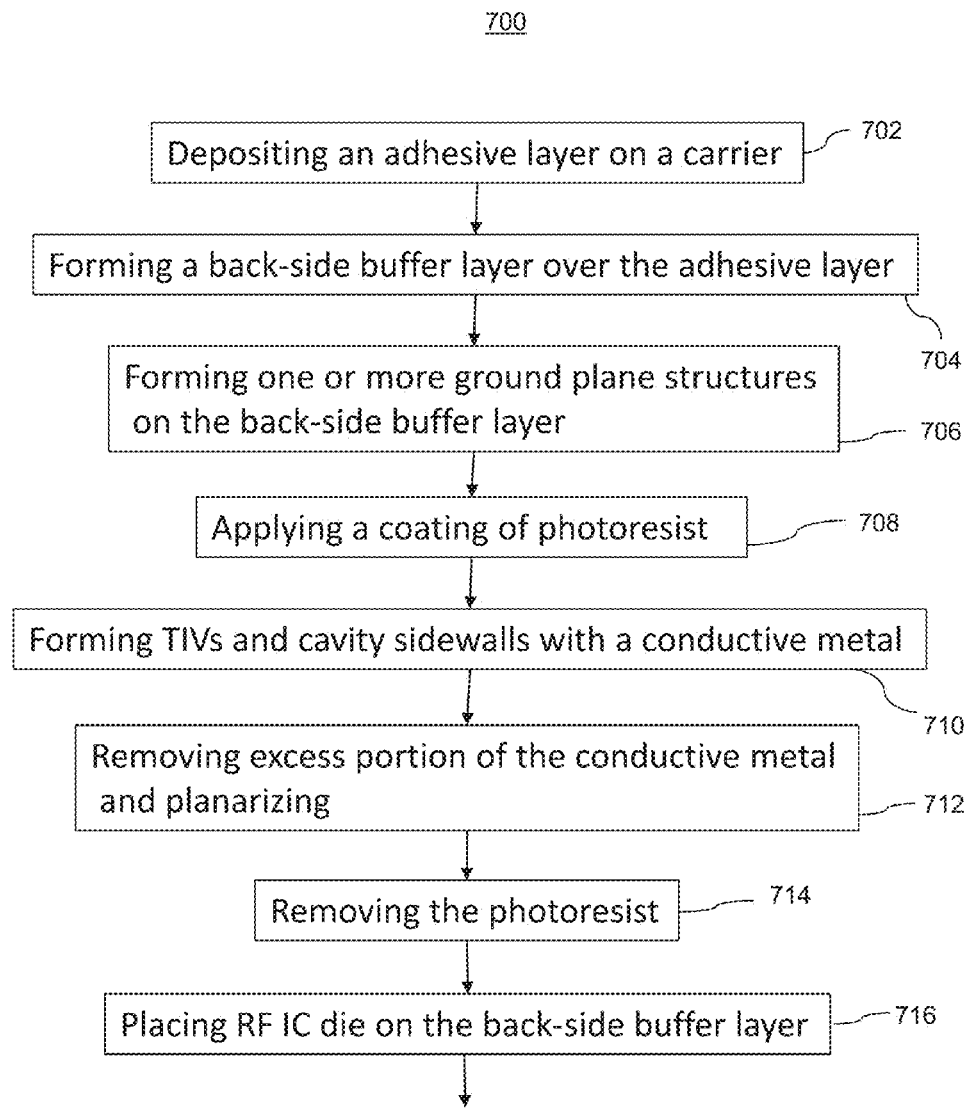
FIGS. 33A-33B show a flow chart of the method of manufacturing the InFO package in accordance with some embodiments.
Figure 33B:
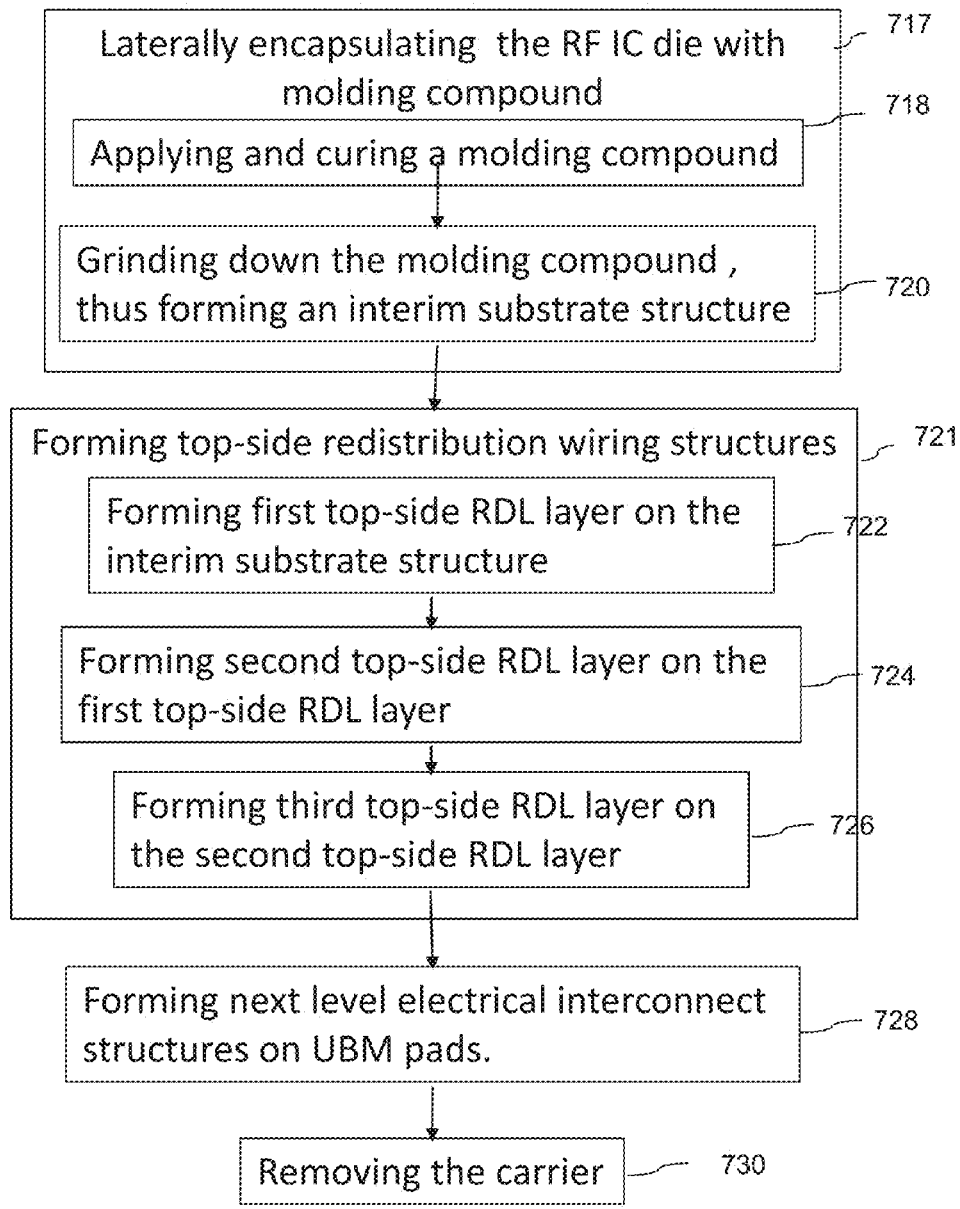

FIGS. 33A-33B show a flow chart 700 of a method of manufacturing the InFO package 300 in accordance with some embodiments. Referring to block 702, the adhesive layer 20 is deposited on the carrier 10. Next, the back-side buffer layer 30 is formed over the adhesive layer 20. (See block 704). Next, one or more of the ground plane structures 510 are formed on the back-side buffer layer. (See block 706). Next, a coating of photoresist 40 is applied over the ground plane structure 510 and the exposed portions of the back-side buffer layer 30 and patterned to form openings or recesses 45 in the photoresist 40. (See block 708). Next, one or more TIVs 303 and one or more cavity sidewalls 303A are formed by filling the recesses 45 with conductive metal 60. (See block 710). Next, the excess portion of the conductive metal 60 is removed and planarized, exposing the tops of the recesses 45, which are now filled with the conductive metal 60, and the photoresist layer 40. (See block 712). Next, photoresist 40 is removed leaving behind the TIVs 303 and the cavity sidewalls 303A structures. (See block 714). Next, the RF IC die 310 is placed on the back-side buffer layer 30. (See block 716).

Next, an encapsulating medium, such as a molding compound is flowed over the RF IC die 310, TIVs 303 and ground plane structures 510. An interim substrate structure 300-I that comprises the RF IC die, the one or more TIVs, the one or more cavity sidewalls, and a molding compound 70 is formed by laterally encapsulating the RF IC die, the one or more TIVs, the one or more cavity sidewalls, with the molding compound, wherein the cavity sidewalls and their associated ground plane structure define one or more antenna cavities. (See block 717). In the interim substrate structure 300-I, the molding compound at least laterally encapsulates the RF IC die 310 between a first surface 71 of the molding compound and a second surface 72 of the molding compound. The one or more TIVs 303 and the one or more cavity sidewalls 303A are in the molding compound and extend from the ground plane structure 510 to the second surface 72 of the molding compound, wherein the cavity sidewalls and their associated ground plane structure 510 define one or more antenna cavities 327.

To form the interim substrate structure 300-I, a molding compound 70 is applied over the RF IC die 310, the TIVs 303, and the cavity sidewalls 303A, filling the gaps between the RF IC die 310, the TIVs 303, and the cavity sidewalls 303A, and cured. (See block 718). Next, the molding compound 70 is ground down until the tops of the metal pillars 315, the TIVs 303, and the cavity sidewalls 303A are exposed, thus forming the interim substrate structure 300-I. (See block 720). At this point, the cavity sidewalls 303A and their associated ground plane 510 define the antenna cavities 327 according to the present disclosure.

Next, a top-side RDL wiring structure 400 that includes one or more integrated patch antenna structure 427 is formed. (See block 721). As mentioned above, the one or more integrated patch antenna structure is coupled to the RF IC die 310 and each of the one or more integrated patch antenna structure is positioned over one of the antenna cavities 327. The forming of the top-side RDL wiring structure 400 comprises forming the first top-side RDL layer 410 on the ground surface of the interim substrate structure, wherein the first top-side RDL layer 410 including the first level conductor RDL-1 412 structures over the TIVs 303 and the metal pillars 315 of the RF IC die 310. (See block 722). Next, the second top-side RDL layer 420 is formed on the first top-side RDL layer 410, wherein the second top-side RDL layer 420 includes the second level conductor RDL-2 422 structures over the first top-side RDL layer 410, the second level conductor RDL-2 422 structures including the one or more patch antenna structures 427 that are positioned over the antenna cavity 327. (See block 724). Next, the third top-side RDL layer 430 is formed on the second top-side RDL layer 420, wherein the third top-side RDL layer 430 includes the third level conductor RDL-3 432 structures including the UBM pads 435. (See block 726). Next, the next level electrical interconnection structures 600 are formed on the UBM pads 435. (See block 728). Next, the carrier 10 is removed, thus forming the InFO package 300. (See block 730).

The InFO process is robust and, thus, the thickness of the InFO package 300 can be fabricated to be within a wide range of thickness. For example, the InFO package can be fabricated to have a thickness that is anywhere from 200 μm to 2.0 mm for the $5^{th}$ generation high frequency RF transceiver application.

Although the subject matter has been described in terms of exemplary embodiments, it is not limited thereto. Rather, the appended claims should be construed broadly, to include other variants and embodiments, which may be made by those skilled in the art.

What is claimed is:

1. A method comprising:
   forming an integrated fan-out package comprising:
      depositing an adhesive layer on a carrier;
      forming a back-side buffer layer over the adhesive layer;
      forming a back-side redistribution metal layer on the back-side buffer layer, wherein the back-side redistribution metal layer includes one or more ground plane structures;
      forming one or more through-insulator vias (TIVs) and one or more cavity sidewalls on the one or more ground plane structures;
      placing a radio frequency (RF) integrated circuit (IC) die on the back-side buffer layer;
      laterally encapsulating the RF IC die, the one or more TIVs, the one or more cavity sidewalls, with a molding compound, thus forming an interim substrate, wherein the cavity sidewalls and their associated ground plane structure define one or more antenna cavities; and
      forming a top-side redistribution (RDL) wiring structure on the interim substrate, the top-side RDL wiring structure including one or more integrated patch antenna structure, wherein the one or more integrated patch antenna structure is coupled to the RF IC die and each of the one or more integrated patch antenna structure is positioned over one of the antenna cavities.

2. The method of claim 1, wherein forming the top-side RDL wiring structure comprises:
   forming a first top-side RDL layer on the interim substrate structure, wherein the first top-side RDL layer includes first level RDL conductor structures over the TIVs and the RF IC die; and
   forming a second top-side RDL layer on the first top-side RDL layer, wherein the second top-side RDL layer includes second level RDL conductor structures over the first top-side RDL layer, wherein the second level RDL conductor structures includes the one or more patch antenna structures.

3. The method of claim 2, further comprising:
   forming a third top-side RDL layer on the second top-side RDL layer, wherein the third top-side RDL layer includes third level RDL conductor structures, wherein the third level RDL conductor structures including one or more under ball metal (UBM) pads.

4. The method of claim 3, further comprising forming solder ball interconnection structures on the UBM pads.

5. The method of claim 4, further comprising removing the carrier.

6. The method of claim 1, wherein forming one or more TIVs and one or more cavity sidewalls on the one or more ground plane structures comprises:
   applying a coating of photoresist over the one or more ground plane structure and any exposed portions of the back-side buffer layer;
   patterning the photoresist to form recesses;
   filling the recesses with a conductive metal to form the one or more TIVs and the one or more cavity sidewalls;
   removing and planarizing a portion of the conductive metal exposing the tops of the recesses, and the photoresist layer, wherein the recesses are now filled with the conductive metal; and
   removing the photoresist leaving behind the TIVs and the cavity sidewalls structures.

7. The method of claim 6, wherein forming the top-side RDL wiring structure comprises:
   forming a first top-side RDL layer on the interim substrate structure, wherein the first top-side RDL layer includes first level RDL conductor structures over the TIVs and the RF IC die; and forming a second top-side RDL layer on the first top-side RDL layer, wherein the second top-side RDL layer includes second level RDL conductor structures over the first top-side RDL layer, wherein the second level RDL conductor structures includes the one or more patch antenna structures.

8. The method of claim 7, further comprising:
forming a third top-side RDL layer on the second top-side RDL layer, wherein the third top-side RDL layer includes third level RDL conductor structures, wherein the third level RDL conductor structures including one or more under ball metal (UBM) pads.

9. The method of claim 8, further comprising forming solder ball interconnection structures on the UBM pads.

10. The method of claim 9, further comprising removing the carrier.

11. A method comprising:
forming an integrated fan-out package comprising:
depositing an adhesive layer on a carrier;
forming a back-side buffer layer over the adhesive layer;
forming a back-side redistribution metal layer on the back-side buffer layer, wherein the back-side redistribution metal layer includes one or more ground plane structures;
forming one or more through-insulator vias (TIVs) and one or more cavity sidewalls on the one or more ground plane structures;
placing a radio frequency (RF) integrated circuit (IC) die on the back-side buffer layer;
laterally encapsulating the RF IC die, the one or more TIVs, the one or more cavity sidewalls, with a molding compound, wherein the laterally encapsulating comprises:
applying the molding compound over the RF IC die, the one or more TIVs, and the one or more cavity sidewalls;
curing the molding compound; and
grinding the molding compound until tops of the TIVs, the cavity sidewalls, and metal pillars on the RF IC die are exposed, thus forming an interim substrate structure, wherein the cavity sidewalls and their associated ground plane structure define one or more antenna cavities; and
forming a top-side redistribution (RDL) wiring structure on the interim substrate, the top-side RDL wiring structure including one or more integrated patch antenna structure,
wherein the one or more integrated patch antenna structure is coupled to the RF IC die and each of the one or more integrated patch antenna structure is positioned over one of the antenna cavities.

12. The method of claim 11, wherein forming the top-side RDL wiring structure comprises:
forming a first top-side RDL layer on the ground surface of the interim substrate structure, wherein the first top-side RDL layer includes first level RDL conductor structures over the TIVs and the RF IC die; and
forming a second top-side RDL layer on the first top-side RDL layer, wherein the second top-side RDL layer includes second level RDL conductor structures over the first top-side RDL layer, wherein the second level RDL conductor structures includes the one or more patch antenna structures.

13. The method of claim 12, further comprising:
forming a third top-side RDL layer on the second top-side RDL layer, wherein the third top-side RDL layer includes third level RDL conductor structures, wherein the third level RDL conductor structures including one or more under ball metal (UBM) pads.

14. The method of claim 13, further comprising forming solder ball interconnection structures on the UBM pads.

15. The method of claim 14, further comprising removing the carrier.

16. A method comprising:
forming an integrated fan-out package comprising:
depositing an adhesive layer on a carrier;
forming a back-side buffer layer over the adhesive layer;
forming a back-side redistribution metal layer on the back-side buffer layer, wherein the back-side redistribution metal layer includes one or more ground plane structures;
applying a coating of photoresist over the one or more ground plane structure and any exposed portions of the back-side buffer layer;
patterning the photoresist to form recesses;
filling the recesses with a conductive metal to form the one or more through-insulator vias (TIVs) and one or more cavity sidewalls;
removing and planarizing a portion of the conductive metal exposing the tops of the recesses, and the photoresist layer, wherein the recesses are now filled with the conductive metal;
removing the photoresist leaving behind the TIVs and the cavity sidewalls structures;
placing a radio frequency (RF) integrated circuit (IC) die on the back-side buffer layer;
laterally encapsulating the RF IC die, the one or more TIVs, the one or more cavity sidewalls, with a molding compound, thus forming an interim substrate, wherein the cavity sidewalls and their associated ground plane structure define one or more antenna cavities; and
forming a top-side redistribution (RDL) wiring structure on the interim substrate, the top-side RDL wiring structure including one or more integrated patch antenna structure, wherein the one or more integrated patch antenna structure is coupled to the RF IC die and each of the one or more integrated patch antenna structure is positioned over one of the antenna cavities.

17. The method of claim 16, wherein forming the top-side RDL wiring structure comprises:
forming a first top-side RDL layer on the interim substrate structure, wherein the first top-side RDL layer includes first level RDL conductor structures over the TIVs and the RF IC die; and
forming a second top-side RDL layer on the first top-side RDL layer, wherein the second top-side RDL layer includes second level RDL conductor structures over the first top-side RDL layer, wherein the second level RDL conductor structures includes the one or more patch antenna structures.

18. The method of claim 17, further comprising:
forming a third top-side RDL layer on the second top-side RDL layer, wherein the third top-side RDL layer includes third level RDL conductor structures, wherein the third level RDL conductor structures including one or more under ball metal (UBM) pads.

19. The method of claim 18, further comprising forming solder ball interconnection structures on the UBM pads.

20. The method of claim 19, further comprising removing the carrier.

\* \* \* \* \*